United States Patent
Takatori et al.

(10) Patent No.: US 7,952,390 B2
(45) Date of Patent: May 31, 2011

(54) LOGIC CIRCUIT HAVING GATED CLOCK BUFFER

(75) Inventors: Atsuo Takatori, Kawasaki (JP); Shuji Hamada, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 186 days.

(21) Appl. No.: 12/320,684

(22) Filed: Feb. 2, 2009

(65) Prior Publication Data

US 2009/0273383 A1  Nov. 5, 2009

(30) Foreign Application Priority Data

Apr. 30, 2008  (JP) ................... 2008-118923

(51) Int. Cl.
    *H03K 19/00*  (2006.01)
(52) U.S. Cl. .................... 326/93; 327/218; 714/726
(58) Field of Classification Search .................... 326/40,
    326/93–98; 327/202, 218; 714/731, 726
    See application file for complete search history.

(56) References Cited

U.S. PATENT DOCUMENTS

| 5,003,204 | A  | * | 3/1991  | Cushing et al. ................. 326/40 |
| 5,281,864 | A  | * | 1/1994  | Hahn et al. ..................... 327/202 |
| 7,222,276 | B2 |   | 5/2007  | Kashiwagi |
| 7,227,383 | B2 | * | 6/2007  | Hoberman et al. ............. 326/93 |
| 7,383,481 | B2 | * | 6/2008  | Warren et al. ................. 714/726 |
| 7,584,393 | B2 | * | 9/2009  | Kamada et al. ............... 714/726 |
| 7,613,972 | B2 | * | 11/2009 | Takeoka et al. ............... 714/731 |
| 2006/0085707 | A1 | * | 4/2006 | Khan et al. .................... 714/726 |

FOREIGN PATENT DOCUMENTS

JP  2002-323540  11/2002

* cited by examiner

*Primary Examiner* — Rexford N Barnie
*Assistant Examiner* — Crystal L Hammond
(74) *Attorney, Agent, or Firm* — Fujitsu Patent Center

(57) ABSTRACT

A logic circuit includes a gated clock buffer including a control node, being set in either a first state or a second state in response to an input signal applied to the control node, outputting an input clock signal supplied as an output signal in the first state, and fixing an output signal to a constant value in the second state, a plurality of scan flip-flops receiving the output signal of the gated clock buffer, and included in at least part of a scan chain, and a combinational logic circuit coupled to at least one of the plurality of scan flip-flops.

10 Claims, 19 Drawing Sheets

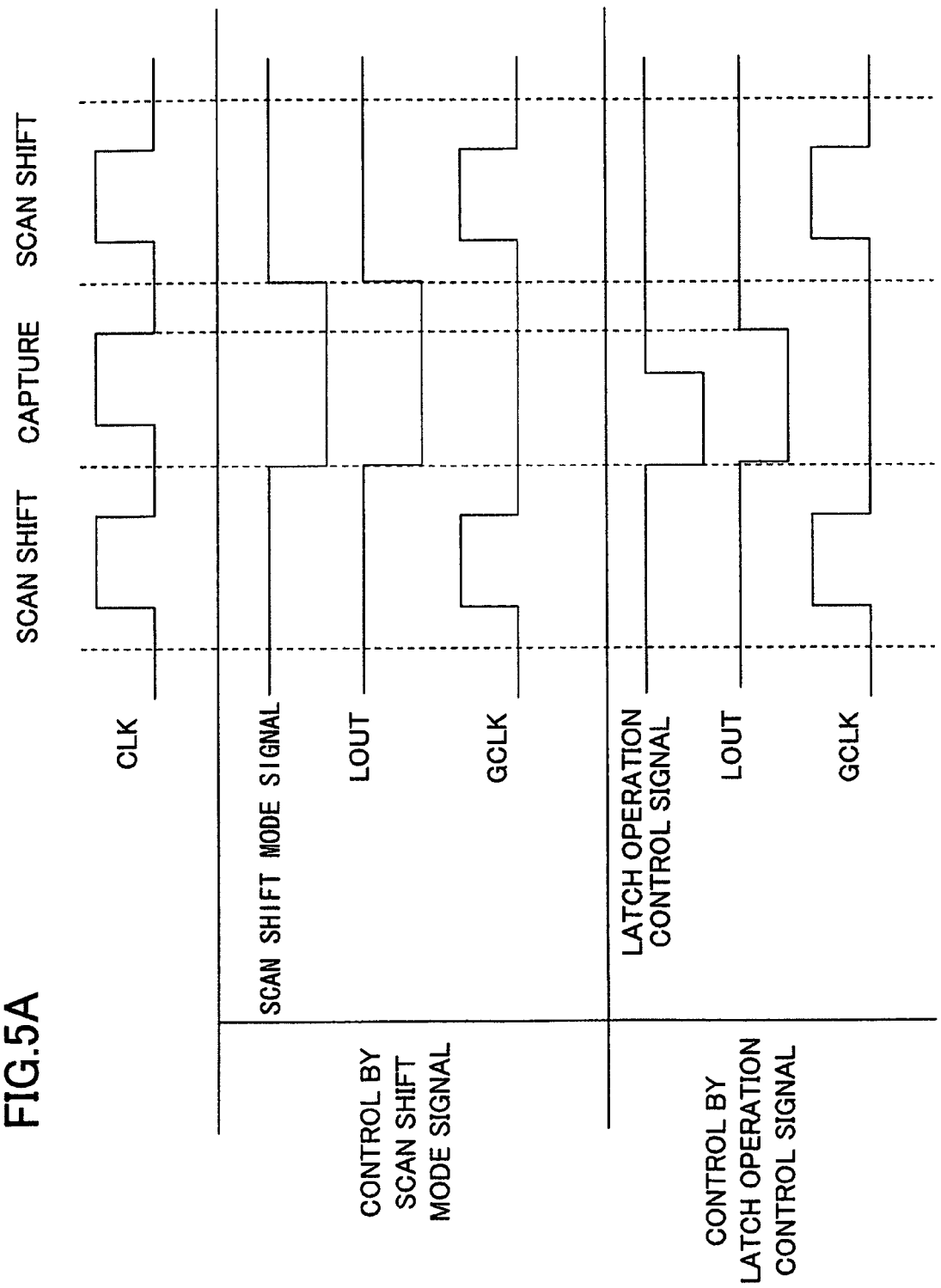

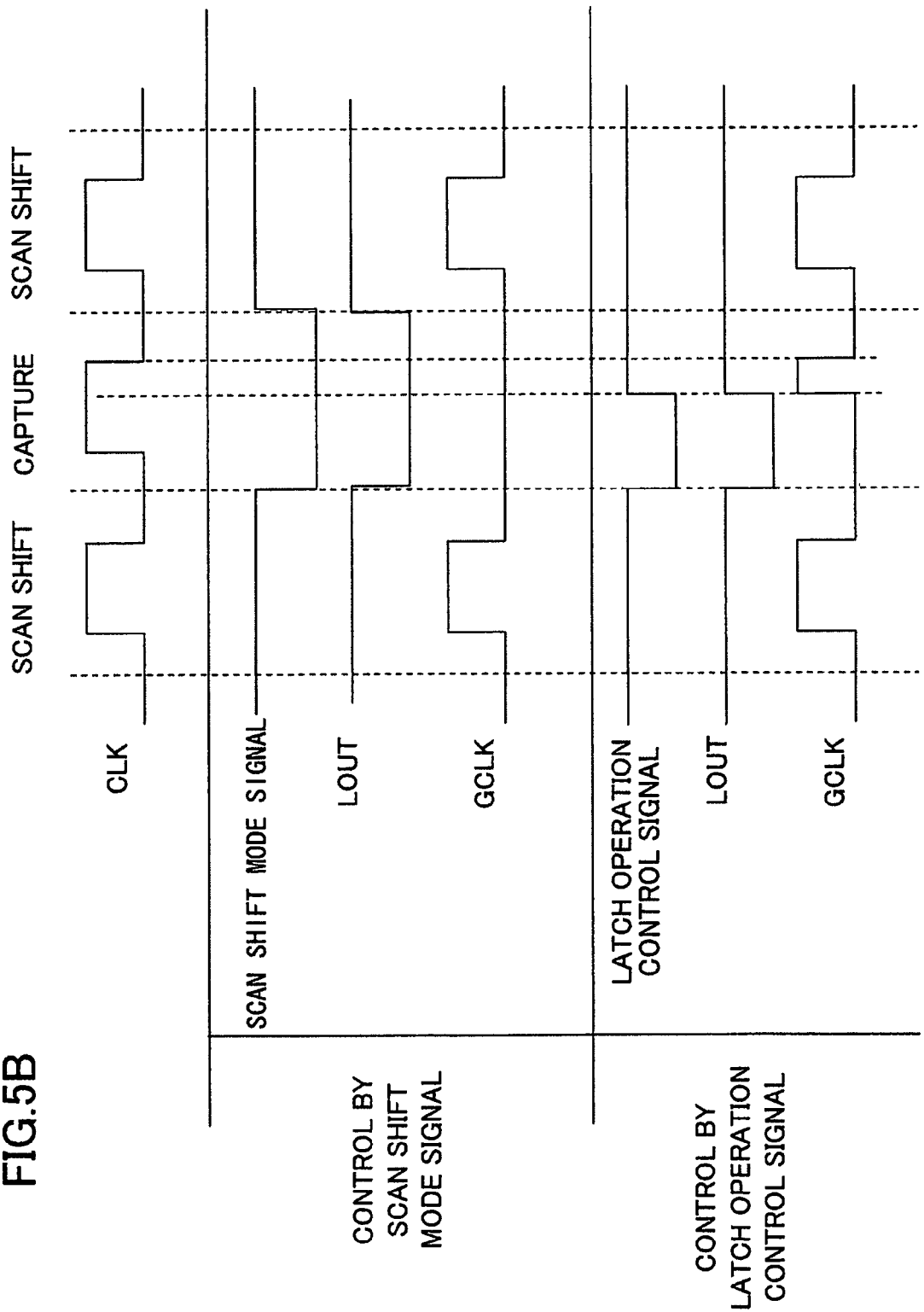

LOGIC CIRCUIT HAVING GATED CLOCK BUFFER

CROSS-REFERENCE TO RELATED APPLICATIONS

The present application is based upon and claims the benefit of priority from the prior Japanese Patent Application No. 2008-118923 filed on Apr. 30, 2008, with the Japanese Patent Office, the entire contents of which are incorporated herein by reference.

FIELD

The embodiments discussed herein are related to a logic circuits including a gated clock buffer.

BACKGROUND

A gated clock scheme controls the operating status of registers (i.e., flip-flops) that operate in synchronization with a clock signal. In the gated clock scheme, the supply of a clock signal to a flip-flop is suspended if the flip-flop is temporarily in such an operating status that no state transition should occur. This prevents the flip-flop from performing a data loading operation. With such control of a clock signal, needless power consumption is eliminated by suspending a data loading operation performed in synchronization with the clock signal.

FIG. 1 is a drawing showing an example of the configuration of a gated clock buffer. Gated clock buffers having the configuration as shown in FIG. 1 are instead along clock-signal supply paths as clock control elements. A gated clock buffer 10 includes a latch circuit 11 and an AND gate 12. The latch circuit 11 allows an input value into a control node EN to pass therethrough to appear as its output value during a period in which a clock signal CLK is 0 (LOW), and sustains an immediately preceding output value during a period in which the clock signal CLK is 1 (HIGH). The output of the latch circuit 11 is supplied to one input of the AND gate 12, and the other input of the AND gate 12 receives the clock signal CLK. The output of the AND gate 12 serves as a gated clock signal GCLK.

When an enable signal "1" applied to the control node EN is output from the latch circuit 11, the gated clock buffer 10 is in the enable state. In this enable state, the clock signal CLK supplied to the gated clock buffer 10 is output as the gated clock signal GCLK without any change. When an enable signal "0" applied to the control node EN is output from the latch circuit 11, the gated clock buffer 10 is in the disable state. In this disable state, the clock signal CLK supplied to the gated clock buffer 10 is blocked, so that the gated clock signal GCLK is fixed to 0. The control node EN of the gated clock buffer 10 is coupled to an output of a logic circuit that performs a logic operation (EN logic) for generating an enable signal.

In order to test a logic circuit in a system LSI that has no need to directly receive/transmit data from/to a device outside the chip, a scan test method is employed that receives/transmits serial data through a single terminal. In the scan test method, each flip-flop constituting the logic circuit has a scan input node and a scan output node. The scan output node of a given flip-flop is coupled to the scan input node of another flip-flop in such a manner that flip-flops are connected in cascade to constitute a flip-flop chain (i.e., scan chain). In a test operation mode, each scan flip-flop in the scan chain loads input data applied to its scan input node, and outputs the stored data from its scan output node in synchronization with a clock signal, in response to a signal indicative of a scan enable state applied from an external device.

An arrangement is typically made such that a clock signal is supplied to the flip-flops all the time during a scan test when a test is performed with respect to a semiconductor integrated circuit employing both the gated clock scheme and the scan test method. Specifically, a signal (e.g., test mode signal) that is kept to "1" all the time during a scan test may be used to fix to 1 the input signal into the control node EN of a gated clock buffer.

FIG. 2 is a drawing showing an example of the configuration in which a clock signal is supplied to flip-flops all the time during a scan test. In FIG. 2, the control node EN of the gated clock buffer 10 is connected to the output of an OR gate 20. The OR gate 20 receives, at its input nodes, a signal output from a logic circuit having EN logic 21 and a signal (e.g., test mode signal) that is kept to 1 all the time during a scan test. At the time of scan test, the output of the OR gate 20 is set to 1, so that the gated clock buffer 10 is kept in the enable state all the time, thereby constantly supplying a clock signal to flip-flops 23 and 24. Here, a flip-flop 22 is provided for the purpose of detecting a failure of the EN logic 21. A check is made as to whether a value stored in the flip-flop 22 is similar to an expected value of the output of the EN logic 21, thereby detecting a failure of the EN logic 21.

In the configuration shown in FIG. 2, there is no need to take into consideration the operation of the gated clock buffer when an automatic test pattern generator (ATPG) is used to generate test patterns for the semiconductor integrated circuit. Namely, test patterns may be generated by ignoring the presence of the gated clock buffer, which makes it easier to generate test patterns. In this case, however, it is not possible to detect a failure of the latch operation of the gated clock buffer by which the input of the latch circuit 11 passes through to appear as an output of the latch circuit 11 all the time. Further, since the input signal into the control node EN is fixed to 1, it is not possible to detect a stuck-at-1 fault and transition delay fault at the position of the control node EN. The term "stuck-at-1 fault" refers to a failure by which the node of interest is fixed to 1 (i.e., stuck at 1). The term "transition delay fault" refers to a failure by which transition timing at the node of interest is delayed to exceed a tolerable range.

Patent Document 1 discloses a configuration in which a signal equivalent to the input into the control node EN of the gated clock buffer shown in FIG. 2 is kept in the enable state all the time during a scan test. In the configuration disclosed in Patent Document 1, it is possible to detect a stuck-at-1 fault, but it is not possible to detect a transition delay fault. Analogous to the configuration shown in FIG. 2, this disclosed configuration may not detect a failure of the latch operation of a gated clock buffer. In this disclosed configuration, further, an existing flip-flop is utilized as an observation point in order to detect a failure of EN logic.

An existing technology for overcoming the problem that a stuck-at-1 fault and/or transition delay fault may not be detected controls an input into the control node EN of the gated clock buffer 10 by use of a scan shift mode signal during a scan test. The scan shift mode signal is set to the enable state (e.g., 1) during a scan shift operation in which scan flip-flops perform shift operations. The scan shift mode signal is set to the disable state (e.g., 0) during a capture operation in which the scan flip-flops load the data output from combinational logic circuits serving as user logics.

FIG. 3 is a drawing showing an example of the configuration in which the input into the control node EN is controlled by use of a scan shift mode signal. In FIG. 3, elements similar to those of FIG. 2 are referred to by similar numerals, and a description thereof will be omitted. In the configuration shown in FIG. 3, the OR gate 20 supplying its output to the control node EN of the gated clock buffer 10 receives a signal output from the logic circuit providing the EN logic 21 and a scan shift mode signal. At the time of a scan shift, the output of the OR gate 20 is set to 1, so that the gated clock buffer 10 is kept in the enable state all the time, thereby constantly supplying a clock signal to the flip-flops 23 and 24. At the time of a capture, the output of the OR gate 20 is set equal to the output of the EN logic 21, so that the enable/disable state of the gated clock buffer 10 is controlled in response to the output value of the EN logic 21.

In the configuration shown in FIG. 3, the enable/disable state of the gated clock buffer 10 is controlled according to the output value of the EN logic 21 during a capture operation, thereby making it possible to detect a stuck-at-1 fault and a transition delay fault. Specifically, the input-side flip-flops (not shown) of the EN logic 21 may be set to such values that the output of the EN logic 21 is set to 0. With this arrangement, the gated clock buffer 10 is placed in the disable state, thereby fixing the gated clock signal GCLK to 0. Further, the flip-flop 24, which is one of the flip-flops receiving the gated clock signal GCLK output from the gated clock buffer 10, is set to 1. Moreover, the data input supplied to the flip-flop 24 from a combinational circuit 25 is set to 0. Namely, an arrangement is made such that a value different from the current value of the flip-flop 24 is supplied as data input to the flip-flop 24.

In this state, one pulse of the clock signal CLK is supplied to the gated clock buffer 10. The gated clock buffer 10 may be in the disable state unless a stuck-at-1 fault exists at the control node EN. In this case, the gated clock signal GCLK is fixed to 0. No clock pulse is thus supplied to the flip-flop 24, and the content of the flip-flop 24 is kept to 1 without change. The gated clock buffer 10 may be in the enable state if a stuck-at-1 fault exists at the control node EN. In this case, clock pulses appear as the gated clock signal GCLK. A clock pulse is supplied to the flip-flop 24, and the content of the flip-flop 24 is changed from 1 to 0. Checking the stored value of the flip-flop 24 may determine whether a stuck-at-1 fault exists at the control node EN. Similarly, a transition delay fault may be detected by checking the stored value of the flip-flop 24.

In the configuration as shown in FIG. 3, there is a need to generate test patterns for detecting a stuck-at-1 fault at the time of test. This gives rise to a problem in that both the processing time of an automatic test pattern generator and the number of generated patterns increase. Analogous to the configuration shown in FIG. 2, further, it is not possible to detect a failure of the latch operation of the gated clock buffer by which the input of the latch circuit 11 passes through to appear as an output of the latch circuit 11 all the time.

Accordingly, there may be a need for a logic circuit that may detect a stuck-at-1 fault, a transition delay fault, a latch operation fault, and the like while suppressing an increase in the number of test patterns.

[Patent Document 1] Japanese Patent Application Publication No. 2002-323540

SUMMARY

At least one embodiment provides a logic circuit. The logic circuit includes a gated clock buffer including a control node, being set in either a first state or a second state in response to an input signal applied to the control node, outputting an input clock signal supplied as an output signal in the first state, and fixing an output signal to a constant value in the second state, a plurality of scan flip-flops receiving the output signal of the gated clock buffer, and included in at least part of a scan chain, and a combinational logic circuit coupled to at least one of the plurality of scan flip-flops, wherein the input signal is controlled by a signal switchable between at least a first signal and a second signal, the first signal assuming an enable value during a test using the scan chain, the second signal assuming an enable value during a scan shift in which the scan chain performs a shift operation and assuming a disable value during at least a part of a capture time in which the at least one of the plurality of scan flip-flops loads data from the combinational logic circuit.

BRIEF DESCRIPTION OF THE DRAWINGS

Other objects and further features of the present embodiments will be apparent from the following detailed description when read in conjunction with the accompanying drawings, in which:

FIG. 5A is a drawing for explaining the detection of a latch operation fault by use of a latch operation control signal;

FIG. 5B is a drawing for explaining the detection of a latch operation fault by use of a latch operation control signal;

DESCRIPTION OF THE EMBODIMENTS

In the following, embodiments will be described with reference to the accompanying drawings.

Figure 4:
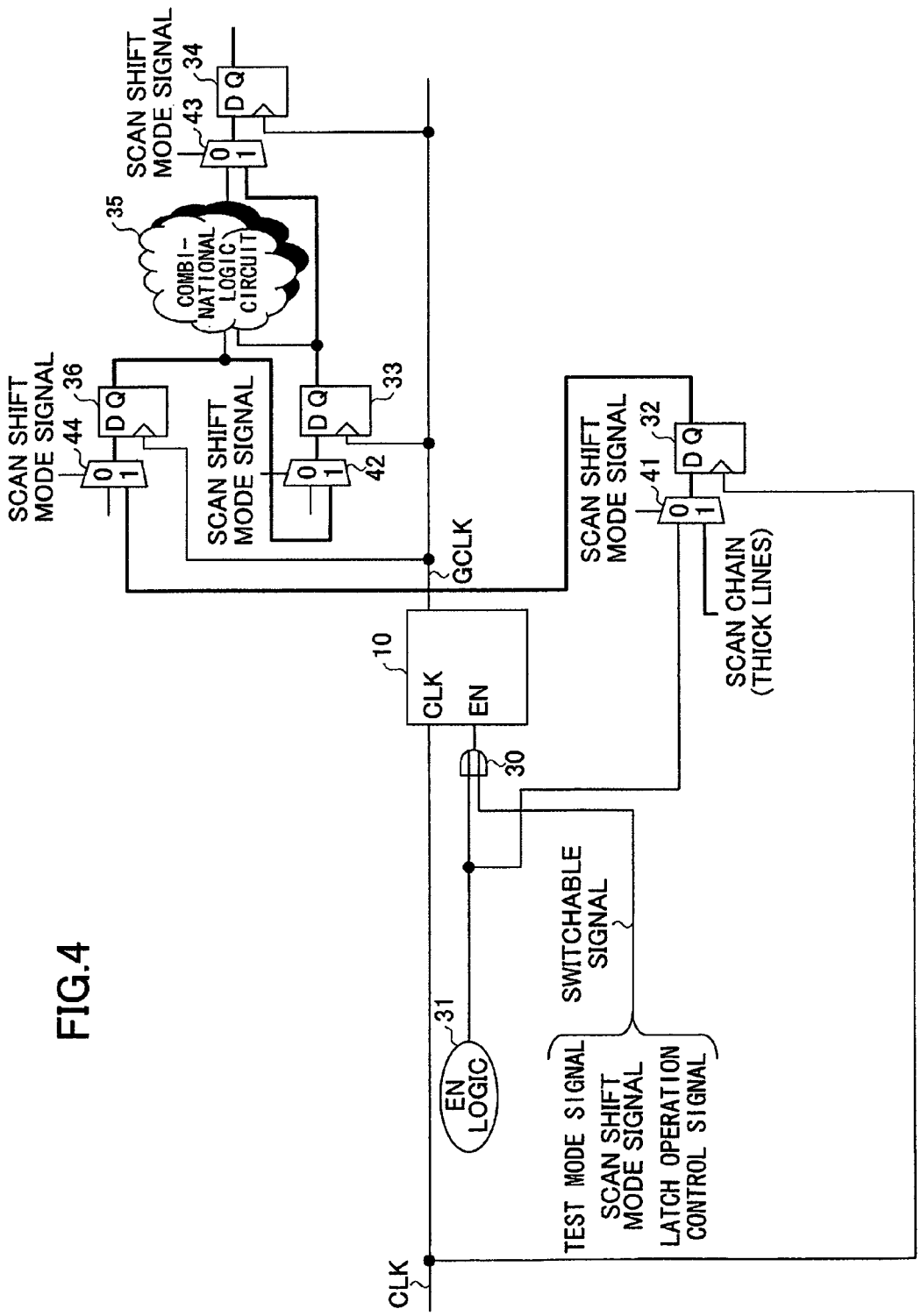
FIG. 4 is a drawing showing an example of the configuration of a logic circuit that employs both the scan test method and the gated clock scheme.

FIG. 4 is a drawing showing an example of the configuration of a logic circuit that employs both the scan test method and the gated clock scheme. The logic circuit shown in FIG. 4 may typically be implemented as a semiconductor integrated circuit, but may alternatively be implemented as a circuit mounted on a system board. The logic circuit of FIG. 4 includes the gated clock buffer 10, an OR gate 30, an EN logic 31, flip-flops 32 through 36, a combinational logic circuit (combinational circuit) 35, and selectors 41 through 44.

Each of the selectors 41 through 44 receives a scan shift mode signal as a selection control signal. As previously described, the scan shift mode signal is set to the enable state (e.g., 1) during a scan shift operation in which scan flip-flops perform shift operations. The scan shift mode signal is set to the disable state (e.g., 0) during a capture operation in which the scan flip-flops load the data output from combinational logic circuits serving as user logics. The flip-flop 32 and the selector 41 together constitute one scan flip-flop. Similarly, the flip-flop 33 and the selector 42, the flip-flop 34 and the selector 43, and the flip-flop 36 and the selector 44 each constitute one scan flip-flop. The output node of a given scan flip-flop is coupled to the scan input node of another scan flip-flop in such a manner that the flip-flops are connected in cascade to constitute a scan chain (shown by thick lines in FIG. 4). At the time of a scan shift, each of the flip-flops constituting the scan chain performs a shift operation in synchronization with the clock signal CLK to successively transfer data to the following scan flip-flop.

Figure 1:
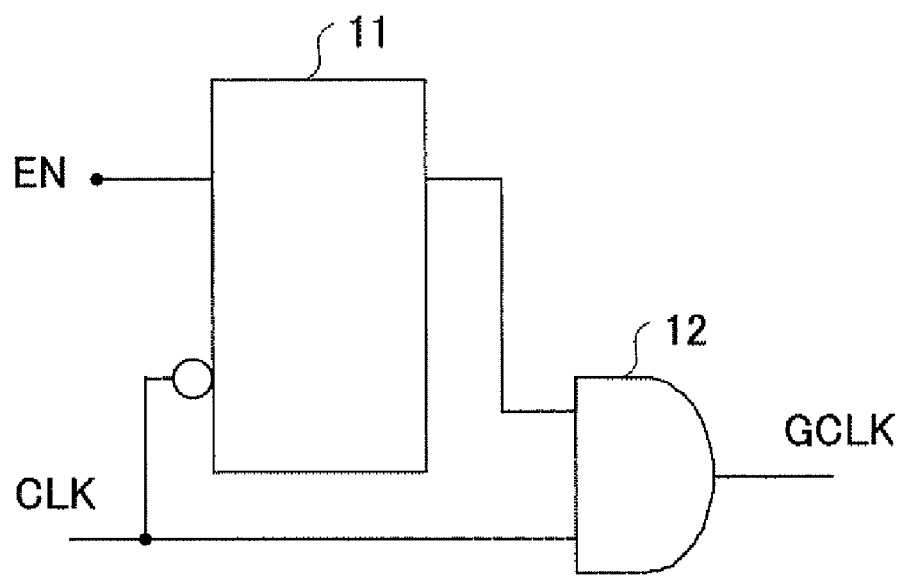
FIG. 1 is a drawing showing an example of the configuration of a gated clock buffer.
Figure 2:
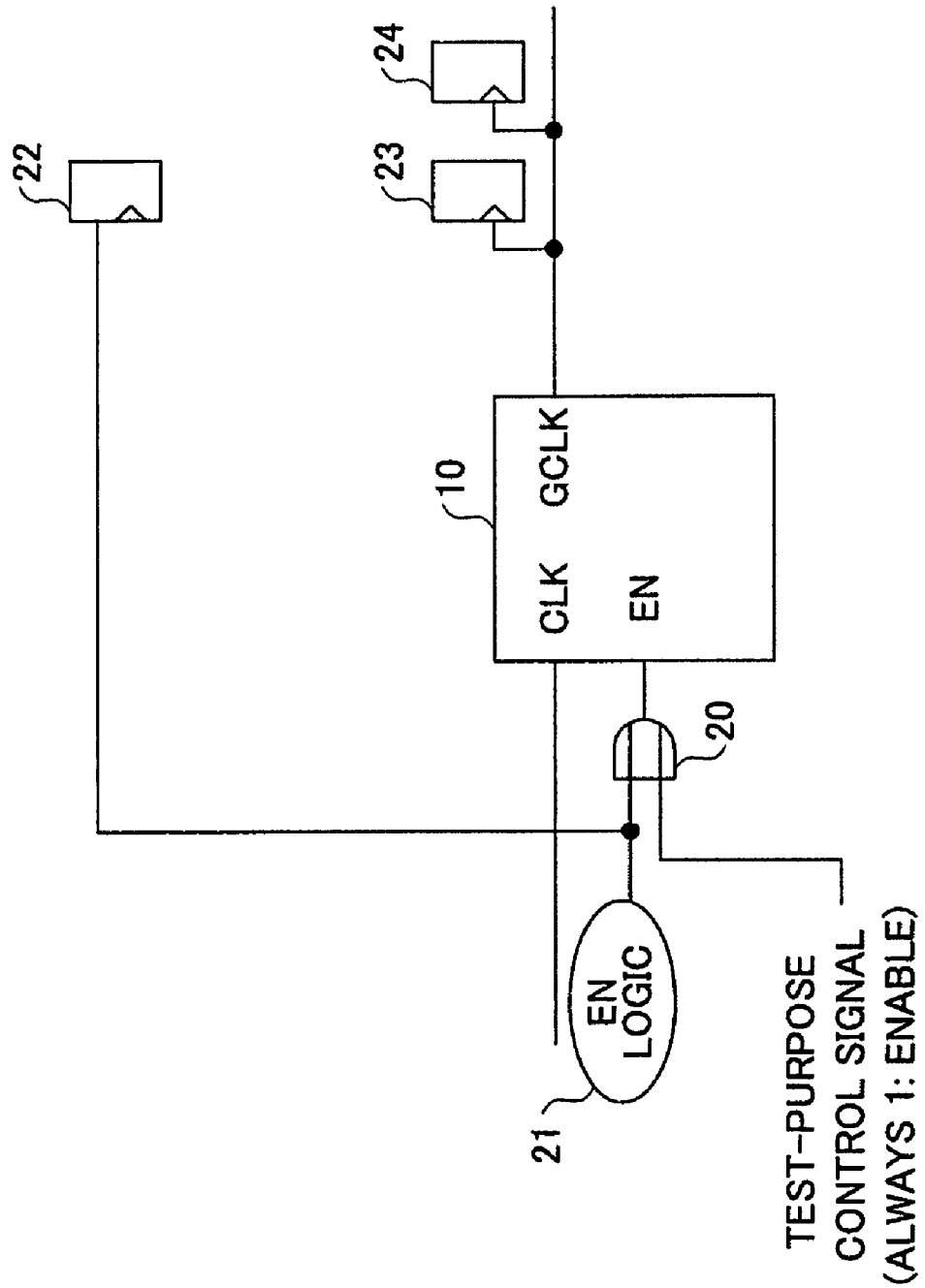
FIG. 2 is a drawing showing an example of the configuration in which a clock signal is supplied to flip-flops all the time during a scan test.
Figure 3:
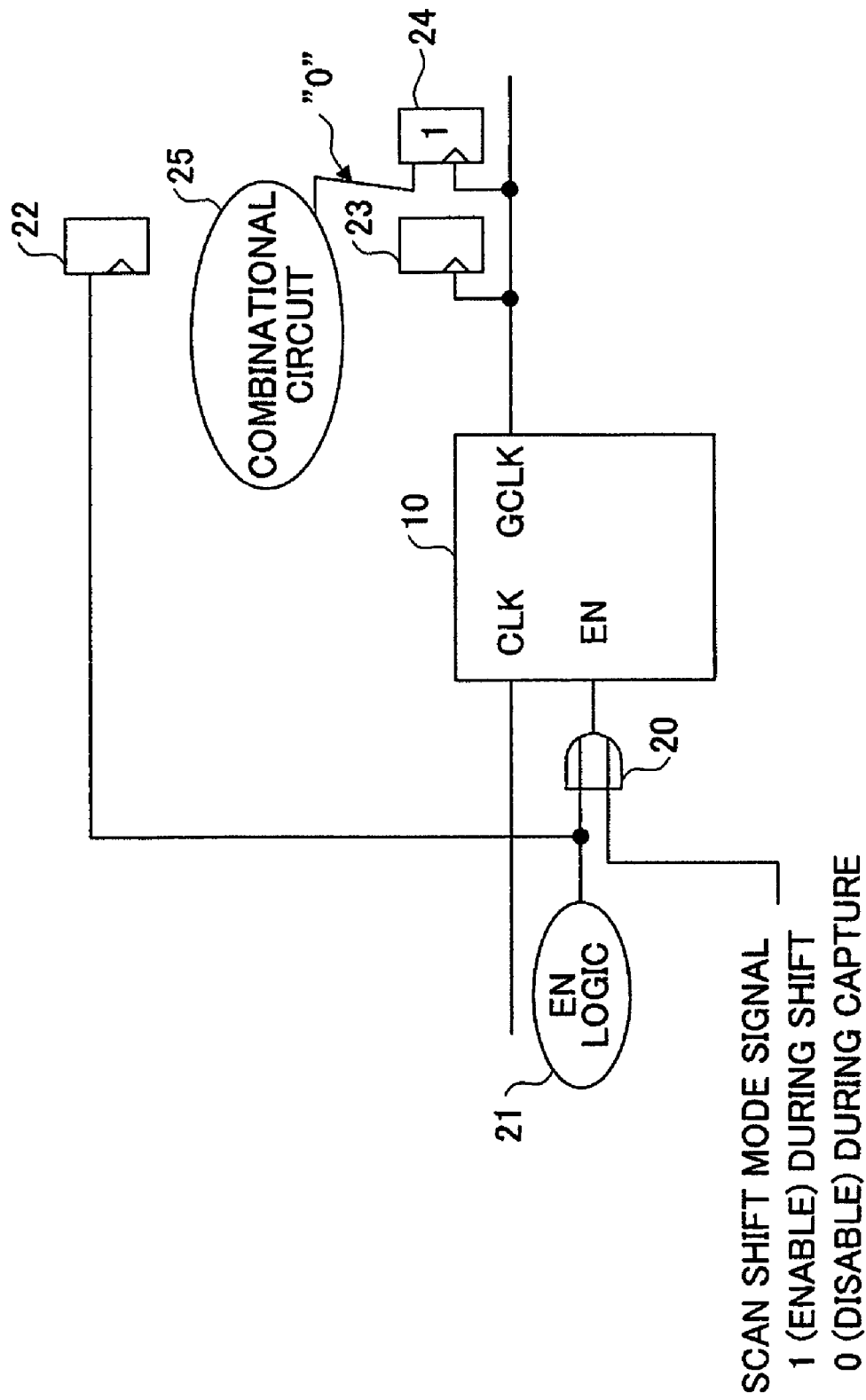
FIG. 3 is a drawing showing an example of the configuration in which the input into a control node is controlled by use of a scan shift mode signal.

The gated clock buffer 10 may have the configuration as shown in FIG. 1, for example. The configuration of the gated clock buffer 10 is not limited to the circuit configuration shown in FIG. 1, and may properly be any configuration that has equivalent logic. Specifically, the gated clock buffer 10 is set to either a first state (i.e., enable state) or a second state (i.e., disable state) in response to an input signal applied to the control node EN. The gated clock buffer 10 passes its input clock signal CLK to its output node without change to output its input clock signal CLK as its output signal (i.e., the gated clock signal GCLK) in the first state, and fixes its output signal (i.e., the gated clock signal GCLK) to a fixed value (e.g., 0) in the second state. In an example shown in FIG. 4, the flip-flops 33, 34, and 36 on the scan chain receive the gated clock signal GCLK output from the gated clock buffer 10.

In the configuration shown in FIG. 4, the OR gate 30 supplying its output to the control node EN of the gated clock buffer 10 receives a signal output from the logic circuit providing the EN logic 31 and a signal for controlling the input into the control node EN. The signal for controlling the input into the control node EN is used to supply the output signal of the logic circuit providing the EN logic 31 to the control node EN without change or to supply a different signal to the control node EN.

The signal for controlling the input into the control node EN is switchable (exchangeable) at least between a first signal and a second signal. The first signal is a signal (e.g., test mode signal) that assumes an enable value all the time during a test using a scan chain. The second signal is a signal that assumes an enable value during a scan shift in which the scan chain performs a shift operation, and that assumes a disable value during at least part of a capture operation in which scan flip flops load data from combinational logic circuits. The second signal may properly be a scan shift mode signal that assumes a disable value all the time during a capture as previously described. Alternatively, the second signal may be a latch operation control signal, which will be described later. The latch operation control signal assumes a disable value during a portion of a capture period, and changes from the disable value to the enable value during a period in which the clock signal CLK input into the gated clock buffer 10 is at the ON state.

In the configuration shown in FIG. 4, the above-noted switchable signal is not fixed to either the first signal or the second signal for all the test operations. The switchable signal is selectively set to either the first signal or the second signal depending on the type of a fault (failure) that is to be tested in the circuit (e.g., depending on whether a latch operation fault is to be tested or a stuck-at-1 fault at the control node EN is to be tested). For example, the first signal is used as the switchable signal when a first test pattern is set in the scan flip-flops for a test. The second signal is used as the switchable signal when a second test pattern different from the first test pattern is set in the scan flip-flops for a test.

FIGS. 5A and 5B are drawings for explaining the detection of a latch operation fault by use of a latch operation control signal. FIG. 5A shows signal waveforms observed when there is no fault with the latch circuit 11 of the gated clock buffer 10. FIG. 5B shows signal waveforms observed when there is a fault with the latch circuit 11 of the gated clock buffer 10. The fault illustrated in FIG. 5B is a type of a fault by which the input of the latch circuit 11 passes through to appear as an output of the latch circuit 11 all the time. In both FIG. 5A and FIG. 5B, an upper waveform set illustrates a case in which the scan shift mode signal is used as the switchable signal shown in FIG. 4, and a lower waveform set illustrates a case in which the latch operation control signal is used as the switchable signal. A signal LOUT shown in these figures is the output signal of the latch circuit 11 shown in FIG. 1. The output of the EN logic 31 shown in FIG. 4 is assumed to be 0. In this case, the signal used as the switchable signal is applied as it is to the control node EN of the gated clock buffer 10.

As shown in FIG. 5A and FIG. 5B, the latch operation control signal assumes an enable value (i.e., 1 in this example) during a scan shift. The latch operation control signal further assumes a disable value (i.e., 0 in this example) during a portion of a capture period, and changes from the disable value to the enable value during a period in which the clock signal CLK input into the gated clock buffer 10 is at the ON state (i.e., 1 in this example).

As shown in the upper waveform set of FIG. 5A, the latch circuit output LOUT assumes a similar waveform to the scan shift mode signal when the scan shift mode signal is used as the switchable signal. The latch circuit 11 passes its input signal (i.e., the scan shift mode signal in this case) to its output node without change during a period in which the clock signal CLK is 0, and sustains an immediately preceding output value (LOUT) during a period in which the clock signal CLK is 1. A signal obtained by performing an AND operation between the latch circuit output LOUT and the clock signal CLK is the gated clock signal GCLK. In this example, each pulse of the clock signal CLK appear as the gated clock signal GCLK by passing through the AND gate 12 (see FIG. 1) during a scan shift, and is blocked by the AND gate 12 so as not to appear as the gated clock signal GCLK during a capture.

As shown in the lower waveform set of FIG. 5A, the latch circuit output LOUT assumes the waveform as illustrated in FIG. 5A when the latch operation control signal is used as the switchable signal. A signal obtained by performing an AND operation between the latch circuit output LOUT and the clock signal CLK is the gated clock signal GCLK. In this example, each pulse of the clock signal CLK appear as the gated clock signal GCLK by passing through the AND gate 12 during a scan shift, and is blocked by the AND gate 12 so as not to appear as the gated clock signal GCLK during a capture.

FIG. 5B shows waveforms observed when there is a fault by which the input of the latch circuit 11 passes through to appear as an output of the latch circuit 11 all the time. As shown in the upper waveform set of FIG. 5B, the latch circuit output LOUT assumes a similar waveform to the scan shift mode signal when the scan shift mode signal is used as the switchable signal. The latch circuit 11 passes its input signal (i.e., the scan shift mode signal in this case) to its output node without change regardless of the 0/1 value of the clock signal. In this example, each pulse of the clock signal CLK appear as the gated clock signal GCLK by passing through the AND gate 12 during a scan shift, and is blocked by the AND gate 12 so as not to appear as the gated clock signal GCLK during a capture.

As shown in the lower waveform set of FIG. 5B, the latch circuit output LOUT assumes a similar waveform to the latch operation control signal when the latch operation control signal is used as the switchable signal. The latch operation control signal assumes 1 during a scan shift, and changes from 0 to 1 during a capture while the clock signal CLK is 1. Accordingly, each pulse of the clock signal CLK appears as the gated clock signal GCLK during a scan shift During a capture, however, a partially-incised pulse appears as the gated clock signal GCLK at the timing at which the latch operation control signal changes from 0 to 1.

As can be seen from comparison between the GCLK signal waveform shown in FIG. 5A and GCLK signal waveform shown in FIG. 5B, the gated clock signal GCLK is similar between the case of no fault and the case of a fault when the scan shift mode signal is used. When the latch operation control signal is used, however, the gated clock signal GCLK differs between the case of no fault and the case of a fault. Namely, a pulse appears as the gated clock signal GCLK during a capture time if there is a fault. The presence/absence of a latch failure may be determined by checking the presence/absence of such a pulse. As can be understood from the above description, a latch operation failure may be detected by using the latch operation control signal and by performing a test with a test pattern set in the scan chain suitable for the detection of a latch operation failure.

Figure 6:
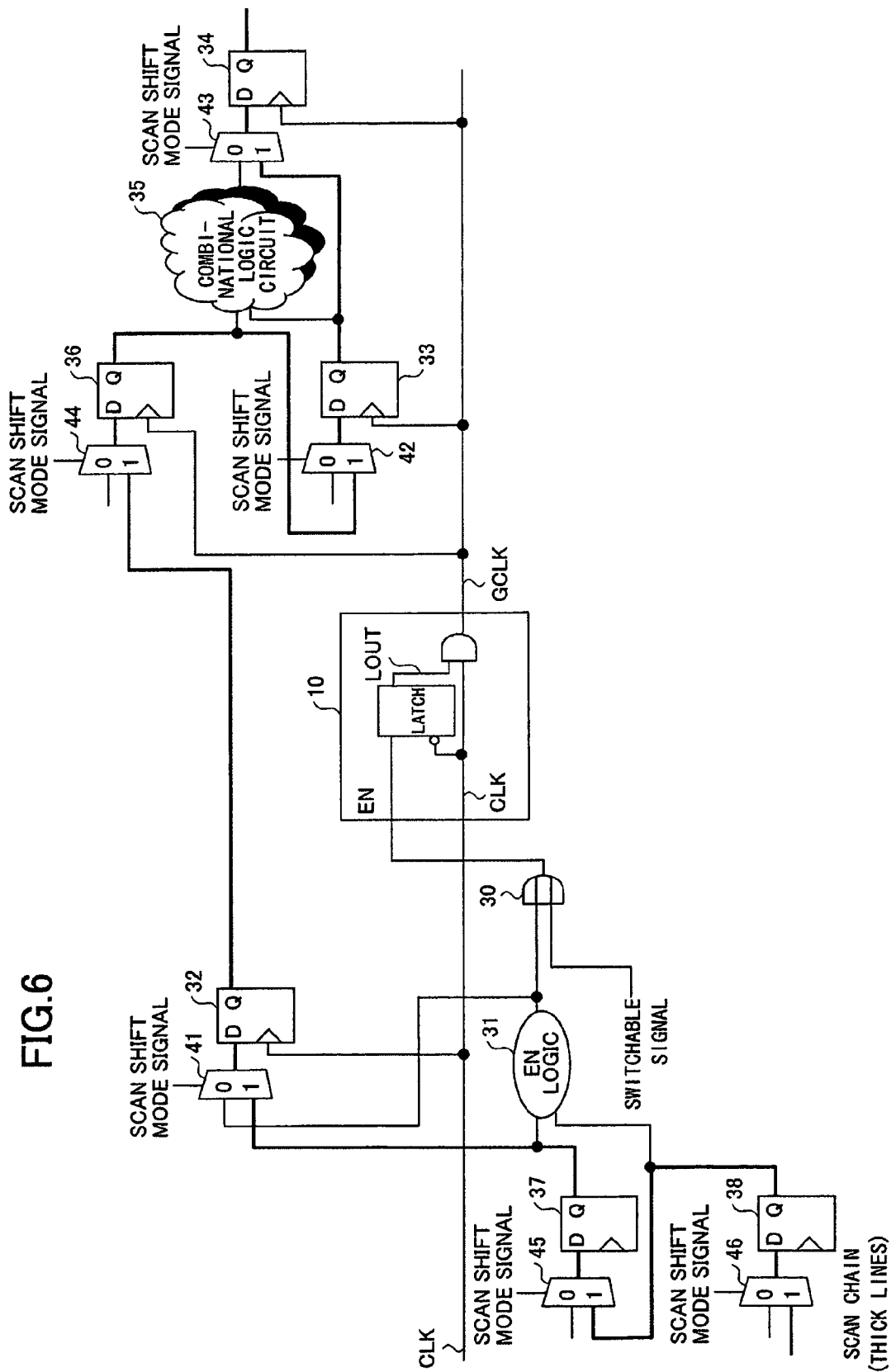
FIG. 6 is a drawing for explaining a fault detection operation.

FIG. 6 is a drawing for explaining a fault detection operation. In FIG. 6, similar elements as those of FIG. 4 are referred to by similar numerals, and a description thereof will be omitted. In FIG. 6, scan flip-flops on the input side of the EN logic 31, which were omitted in the logic circuit shown in FIG. 4, are expressly shown. Namely, the logic circuit shown in FIG. 6 includes flip-flops 37 and 38 and selectors 45 and 46 in addition to the circuit elements shown in FIG. 4. The flip-flop 37 and the selector 45 together constitute one scan flip-flop, and the flip-flop 38 and the selector 46 together constitute another scan flip-flop. These scan flip-flops are included in a scan chain that includes the scan chain shown in FIG. 4.

In order to detect a latch operation fault, the latch operation control signal as shown in FIG. 5A and FIG. 5B is used as the switchable signal input into the OR gate 30. A scan shift operation is performed first. During this operation, the latch operation control signal is set to 1, so that each pulse of the clock signal CLK appear as the gated clock signal GCLK output from the gated clock buffer 10. A scan-in is first performed by this scan shift operation to set a proper test pattern (i.e., bit pattern) to the flip-flops constituting the scan chain. Namely, the shift operation is performed in synchronization with the clock signal CLK while a bit sequence is supplied from an external tester or the like to an external serial-data-input port, thereby setting desired values in the respective flip-flops.

Specifically, the flip-flops 37 and 38 on the input side of the EN logic 31 are set such that the output of the EN logic 31 is set to 0. If the EN logic 31 is a NAND gate, for example, the stored data of the flip-flop 37 and the stored data of the flip-flop 38 are both set to 1. Further, at least one of the flip-flops 33, 34, and 36 that receive the gated clock signal GCLK from the gated clock buffer 10 is set such that its stored value and the input value into the data input node of the corresponding selector are opposite to each other. A selector supplies, to a corresponding flip-flop, data applied to its data input node from a combinational logic circuit providing user logic if the scan shift mode signal is 0 during a capture time. The selector supplies, to the corresponding flip-flop, data applied to its scan input node from a flip-flop situated at the preceding stage of the scan chain if the scan shift mode signal is 1 during a scan shift time.

Data may need to be set in the flip-flop 34 such that the above-described conditions are satisfied when the combinational logic circuit 35 is an AND gate having two inputs, for example. In this case, the flip-flop 33 and the flip-flop 36 are set to 1, so that the output of the combinational logic circuit 35 is 1. Further, the flip-flop 34 is set to 0. With this arrangement, the stored value "0" of the flip-flop 34 and the input value "1" applied to the data input node of the corresponding selector 43 are opposite to each other.

After the above-noted settings are made, a capture operation will be performed. Since the output of the EN logic 31 is set to 0, the input into the control node EN of the gated clock buffer 10 is similar to the latch operation control signal. If the latch operation is free from fault, the output LOUT of the latch circuit 11 of the gated clock buffer 10 and the gated clock signal GCLK output from the gated clock buffer 10 assume signal waveforms as shown in the lower waveform set of FIG. 5A. Namely, there is no pulse in the gated clock signal GCLK during the capture time, so that the flip-flops 33, 34, and 36 shown in FIG. 6 do not perform a capture operation. As a result, the stored value of the flip-flop 34 is kept to 0 without change.

If the latch operation has a fault, the output LOUT of the latch circuit 11 of the gated clock buffer 10 and the gated clock signal GCLK output from the gated clock buffer 10 assume signal waveforms as shown in the lower waveform set of FIG. 5B. Namely, there is a pulse in the gated clock signal GCLK during the capture time, so that the flip-flops 33, 34, and 36 shown in FIG. 6 perform a capture operation. As a result, the stored value of the flip-flop 34 that was set as previously described changes from 0 to 1.

After the above-noted capture operation, a scan shift operation is performed. That is, a shift operation is performed on the scan chain in synchronization with the clock signal CLK, so that the stored values of the flip-flops are sequentially output from an external serial-data-output port for provision to an external tester or the like. As previously described, the stored value of the flip-flop 34 differs between the case of a correct latch operation and the case of a faulty latch operation. By checking the value of the flip-flop 34 by use of a tester or the like, thus, a latch operation fault may be detected.

In the following, the detection of a stuck-at-1 fault at the control node EN of the gated clock buffer 10 will be described by referring to FIG. 6 again. In order to detect a stuck-at-1 fault, the scan shift mode signal is used as the switchable signal input into the OR gate 30.

Figure 7:
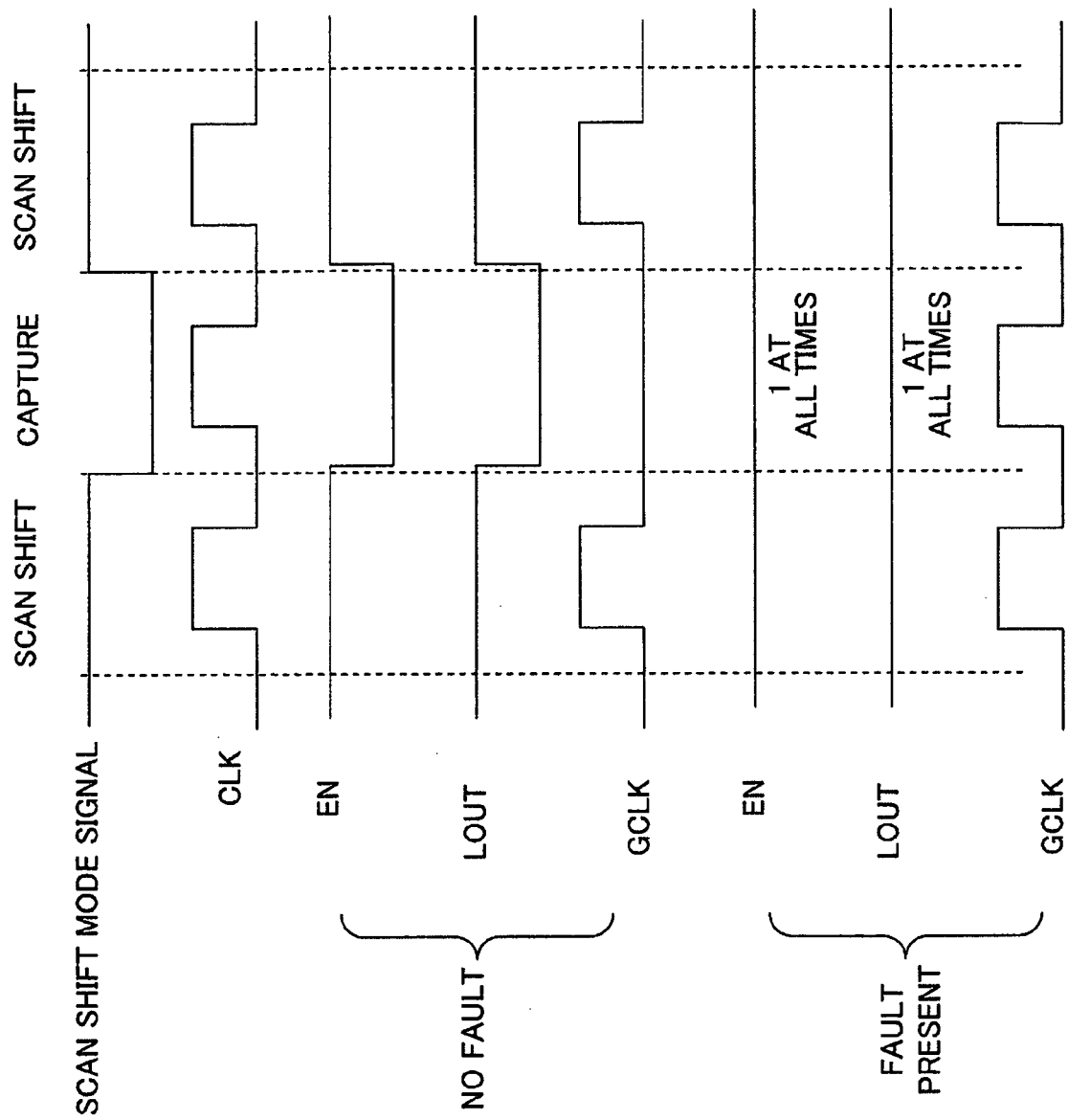
FIG. 7 is a drawing showing a scan shift mode signal and signal waveforms for the respective cases of presence and absence of a stuck-at-1 fault at the control node.

FIG. 7 is a drawing showing a scan shift mode signal and signal waveforms for the respective cases of presence and absence of a stuck-at-1 fault at the control node EN. A scan shift operation is performed first. During this operation, the scan shift mode signal is set to 1, so that each pulse of the clock signal CLK appear as the gated clock signal GCLK output from the gated clock buffer 10. A scan-in is first performed by this scan shift operation to set a proper test pattern (i.e., bit pattern) to the flip-flops constituting the scan chain. The values set to the flip-flops may be similar to those used in the detection of a latch operation fault previously described. Namely, the flip-flops 37 and 38 on the input side of the EN logic 31 are set such that the output of the EN logic 31 is set to 0. Further, the flip-flop 34, which receives the gated clock signal GCLK from the gated clock buffer 10, is set such that its stored value (e.g., 0) and the input value (e.g., 1) into the data input node of the corresponding selector 43 are opposite to each other.

After the above-noted settings are made, a capture operation will be performed. Since the output of the EN logic 31 is set to 0, the input into the control node EN of the gated clock buffer 10 is similar to the scan shift mode signal in the case of a fault-free control node EN. In this case, the output LOUT of the latch circuit 11 of the gated clock buffer 10 and the gated clock signal GCLK output from the gated clock buffer 10 assume signal waveforms as illustrated in a middle waveform set shown in FIG. 7. Namely, there is no pulse in the gated clock signal GCLK during the capture time, so that the flip-flops 33, 34, and 36 shown in FIG. 6 do not perform a capture operation. As a result, the stored value of the flip-flop 34 is kept to 0 without change.

If the control node EN has a stuck-at-1 fault, the input into the control node EN of the gated clock buffer 10 is fixed to 1. In this case, the output LOUT of the latch circuit 11 of the gated clock buffer 10 and the gated clock signal GCLK output from the gated clock buffer 10 assume signal waveforms as illustrated in a lower waveform set shown in FIG. 7. Namely, there is a pulse in the gated clock signal GCLK during the capture time, so that the flip-flops 33, 34, and 36 shown in FIG. 6 perform a capture operation. As a result, the stored value of the flip-flop 34 that was set as previously described changes from 0 to 1.

After the above-noted capture operation, a scan shift operation is performed. That is, a shift operation is performed on the scan chain in synchronization with the clock signal CLK, so that the stored values of the flip-flops are sequentially output from an external serial-data-output port for provision to an external tester or the like. As previously described, the stored value of the flip-flop 34 differs depending on the presence/absence of a stuck-at-1 fault. By checking the value of the flip-flop 34 by use of a tester or the like, thus, a stuck-at-1 fault may be detected. It may be noted that a latch operation control signal may be used in place of the scan shift mode signal to detect a stuck-at-1 fault of the control node EN in a similar manner. With the use of a latch operation control signal, however, a pulse appears in the gated clock signal GCLK during a capture time not only when there is a stuck-at-1 fault but also when there is a latch operation fault. Accordingly, a test that uses only a latch operation control signal may not distinguish a stuck-at-1 fault and a latch operation fault from each other.

In the following, the detection of a transition delay fault at the control node EN of the gated clock buffer 10 will be described by referring to FIG. 6 again. In order to detect a transition delay fault, the scan shift mode signal is used as the switchable signal input into the OR gate 30.

Figure 8:
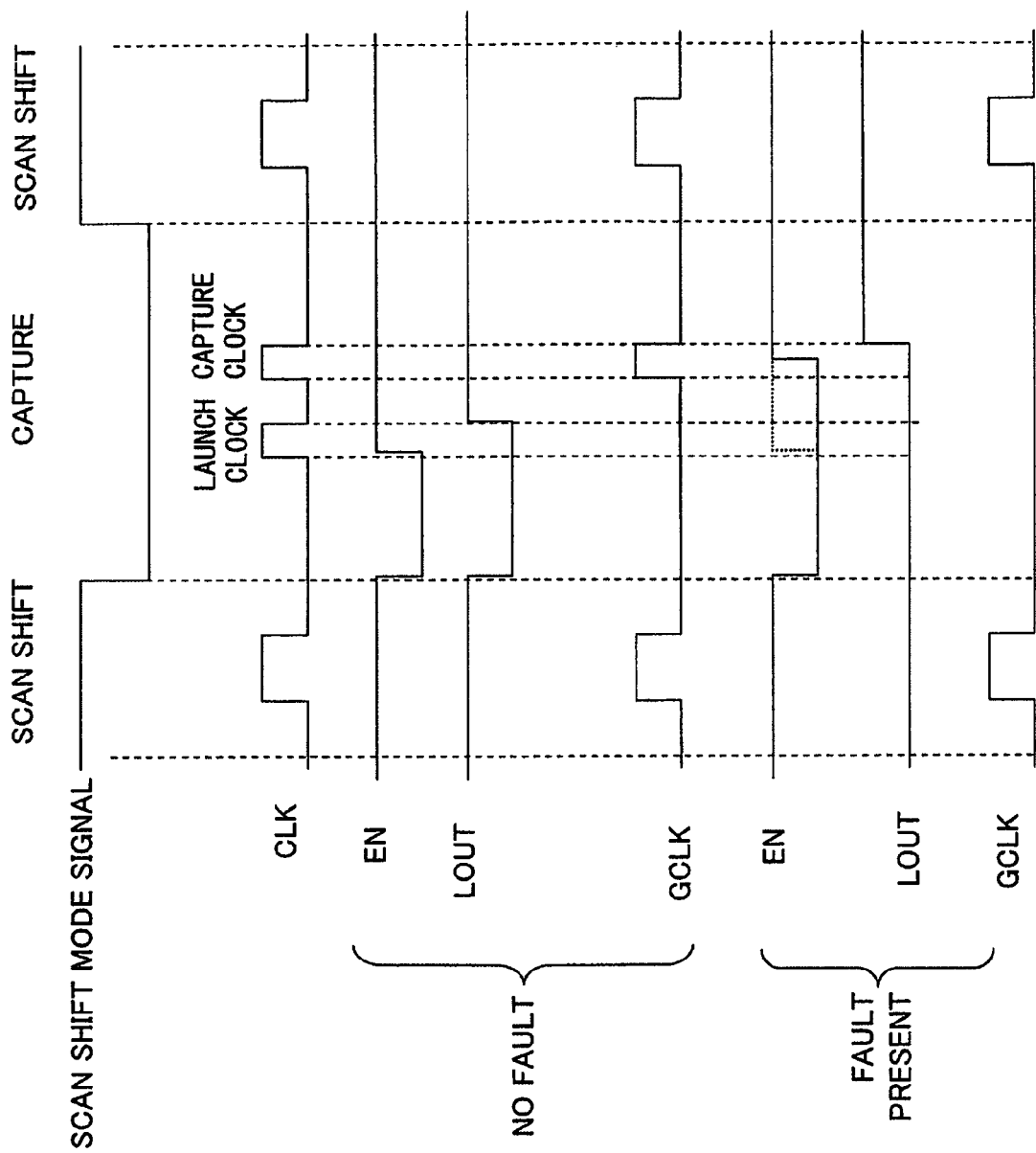
FIG. 8 is a drawing showing a scan shift mode signal and signal waveforms for the respective cases of presence and absence of a transition delay fault at the control node.

FIG. 8 is a drawing showing a scan shift mode signal and signal waveforms for the respective cases of presence and absence of a transition delay fault at the control node EN. A scan shift operation is performed first. During this operation, the scan shift mode signal is set to 1, so that each pulse of the clock signal CLK appear as the gated clock signal GCLK output from the gated clock buffer 10. A scan-in is first performed by this scan shift operation to set a proper test pattern (i.e., bit pattern) to the flip-flops constituting the scan chain. The flip-flops 37 and 38 on the input side of the EN logic 31 are set such that the output of the EN logic 31 changes from 0 to 1 in response to a Launch clock of the capture operation. Further, the flip-flop 34, which receives the gated clock signal GCLK from the gated clock buffer 10, is set such that its stored value (e.g., 0) and the input value (e.g., 1) into the data input node of the corresponding selector 43 are opposite to each other.

After the settings are made by scan-in, a capture operation will be performed. In the capture operation, the scan shift mode signal assumes 0. Accordingly, the input into the control node EN of the gated clock buffer 10 is similar to the output of the EN logic 31. In the case of a fault-free control node EN, the input into the control node EN of the gated clock buffer 10 changes from 0 to 1 prior to the occurrence of a Capture clock that follows the Launch clock. In this case, the input into the control node EN, the output LOUT of the latch circuit 11, and the gated clock signal GCLK output from the gated clock buffer 10 assume signal waveforms as illustrated in a middle waveform set shown in FIG. 8. Namely, there is a pulse in the gated clock signal GCLK during the capture time, so that the flip-flops 33, 34, and 36 shown in FIG. 6 perform a capture operation. As a result, the stored value of the flip-flop 34 that was set as previously described changes from 0 to 1.

In the case of a transition delay fault at the control node EN, the input into the control node EN of the gated clock buffer 10 changes from 0 to 1 after the rising edge of the Capture clock that follows the Launch clock. In this case, the input into the control node EN, the output LOUT of the latch circuit 11, and the gated clock signal GCLK output from the gated clock buffer 10 assume signal waveforms as illustrated in a lower waveform set shown in FIG. 8. Namely, there is no pulse in the gated clock signal GCLK during the capture time, so that the flip-flops 33, 34, and 36 shown in FIG. 6 do not perform a capture operation. As a result, the stored value of the flip-flop 34 is kept to 0 without change.

After the above-noted capture operation, a scan shift operation is performed. That is, a shift operation is performed on the scan chain in synchronization with the clock signal CLK, so that the stored values of the flip-flops are sequentially output from an external serial-data-output port for provision to an external tester or the like. As previously described, the stored value of the flip-flop 34 differs depending on the presence/absence of a transition delay fault. By checking the value of the flip-flop 34 by use of a tester or the like, thus, a transition delay fault may be detected.

As described above, a signal input into the OR gate 30 is switched between the scan shift mode signal and the latch operation control signal, and a test pattern corresponding to this selected signal is set in the flip-flops to detect a fault that one desires to detect. When a fault irrelevant to the gated clock needs to be detected, a test mode signal that assumes 1 all the time during a test is used as the switchable signal. With the use of the test mode signal that is 1 all the time during a test, it suffices to generate a test pattern by disregarding the presence of gated clock buffers without taking into account the operations of the gated clock buffers. Accordingly, test patterns may be generated easily and efficiently by use of an automatic test pattern generator.

Figure 9:
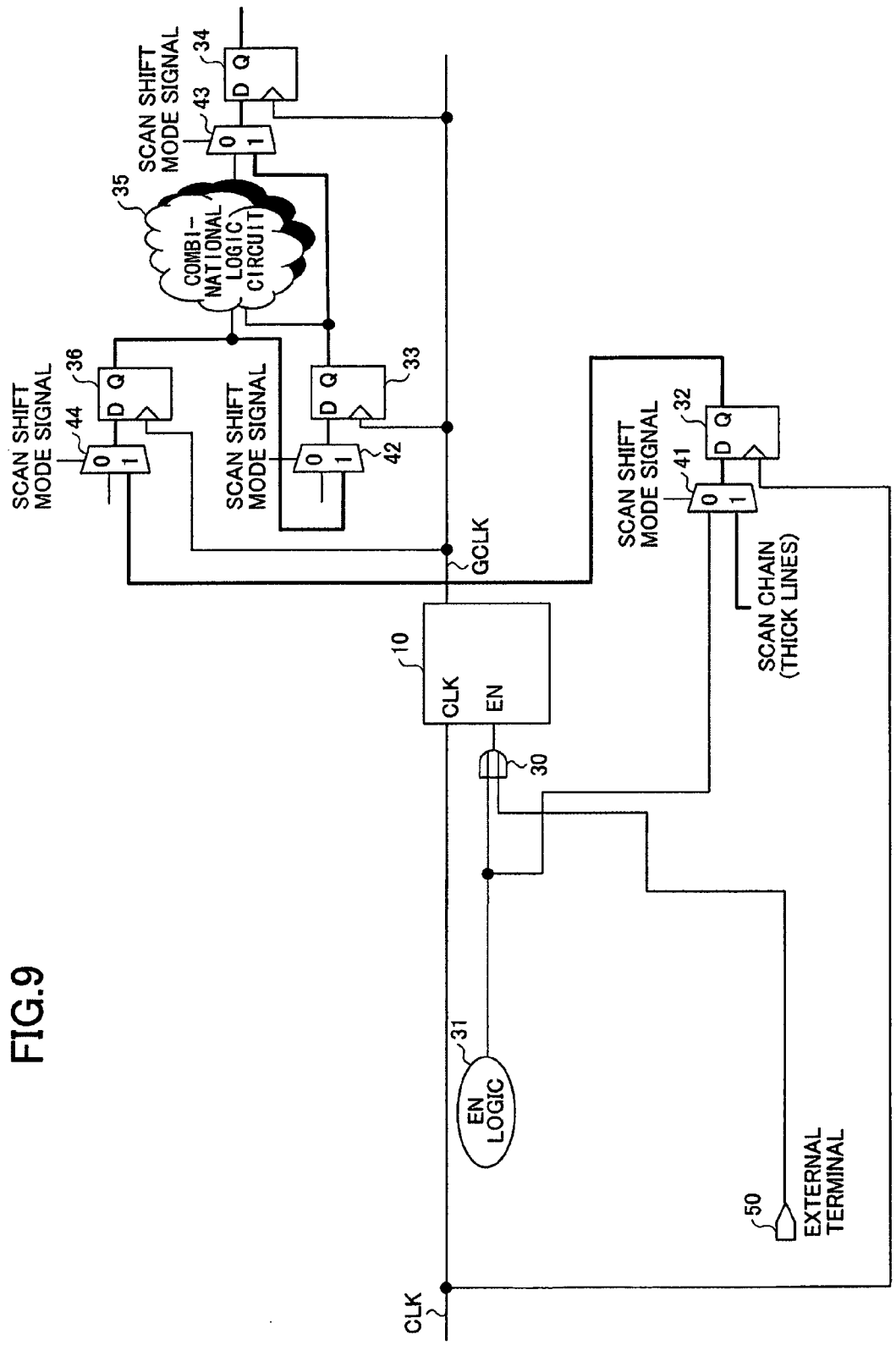
FIG. 9 is a drawing showing a first embodiment of a mechanism for switching a switchable signal.

FIG. 9 is a drawing showing a first embodiment of a mechanism for switching a switchable signal. In FIG. 9, similar elements as those of FIG. 4 are referred to by similar numerals, and a description thereof will be omitted. In the configuration shown in FIG. 9, the switchable signal is supplied from an external tester or the like through an external port (terminal) 50 of the logic circuit.

Figure 10:
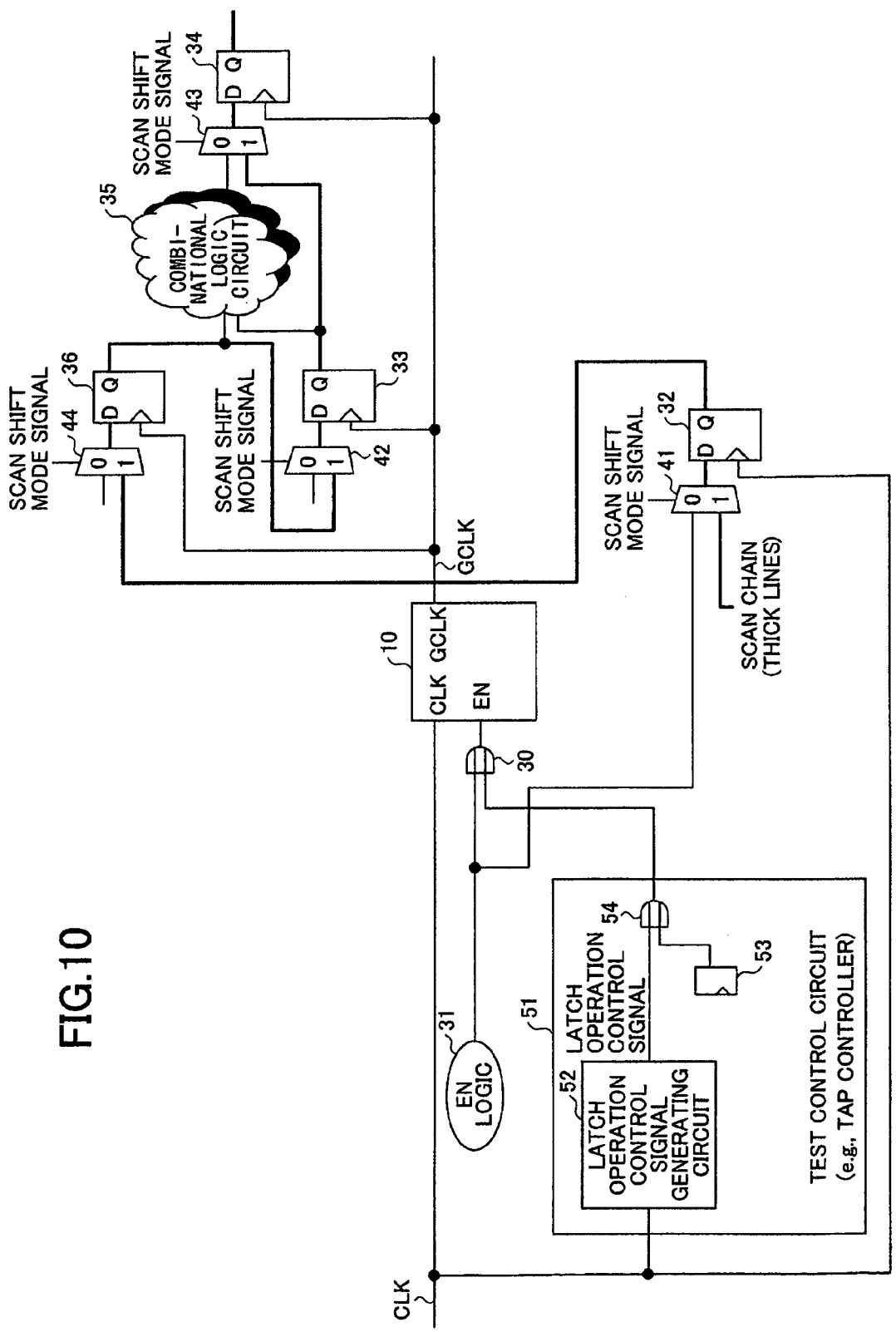
FIG. 10 is a drawing showing a second embodiment of a mechanism for switching a switchable signal.

FIG. 10 is a drawing showing a second embodiment of a mechanism for switching a switchable signal. In FIG. 10, similar elements as those of FIG. 4 are referred to by similar numerals, and a description thereof will be omitted. In the configuration shown in FIG. 10, the switchable signal is generated by a test control circuit 51 such as a TAP controller that is provided as part of an integrator including the logic circuit.

The term "TAP" stands for a test access port, which is used to access circuit blocks on a print circuit board or inside a semiconductor chip from outside to perform a test by use of a boundary scan method. The term "TAP controller" refers to a control circuit that controls the state transition of TAP. An architecture and serial port for use in the boundary scan method are standardized by JTAG (Joint Test Action Group).

In an example shown in FIG. 10, the test control circuit 51 includes a latch operation control signal generating circuit 52 for generating a latch operation control signal, a flip-flop 53 having a value thereof determined by an instruction, and an OR gate 54. When the flip-flop 53 is set to 0, the latch operation control signal generated by the latch operation control signal generating circuit 52 is supplied to the OR gate 30 via the OR gate 54. When the flip-flop 53 is set to 1, for example, a signal that is 1 all the time during a test is supplied to the OR gate 30 via the OR gate 54. When the latch operation control signal generating circuit 52 is inactivated to fix its output to 0, and the value of the flip-flop 53 is switched between 0 and 1 depending on whether a scan shift or a capture is performed, for example, the scan shift mode signal may be supplied to the OR gate 30 via the OR gate 54.

Figure 11:
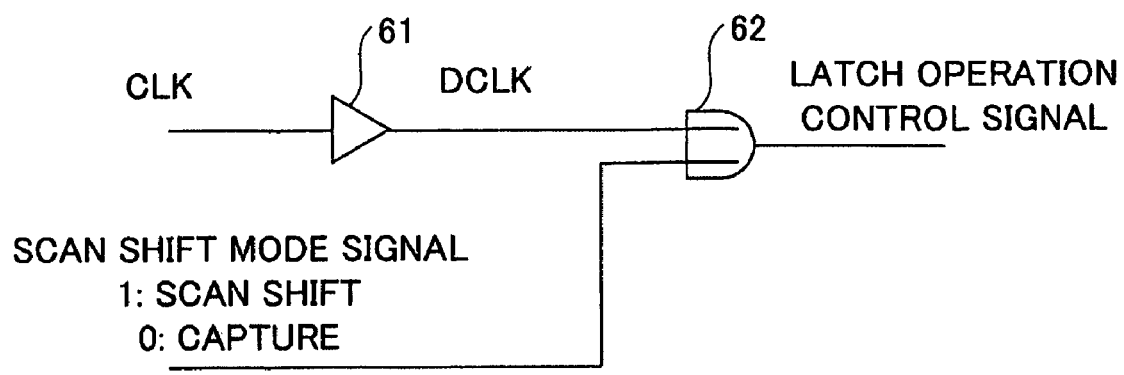
FIG. 11 is a drawing showing an example of the configuration of a latch operation control signal generating circuit.

FIG. 11 is a drawing showing an example of the configuration of the latch operation control signal generating circuit 52. The latch operation control signal generating circuit 52 includes a delay element 61 and an OR gate 62. The clock signal CLK is delayed by the delay element 61 to generate a delayed clock signal DCLK. The OR gate 62 performs an OR operation between the delayed clock signal DCLK and the scan shift mode signal to generate the latch operation control signal.

Figure 12:
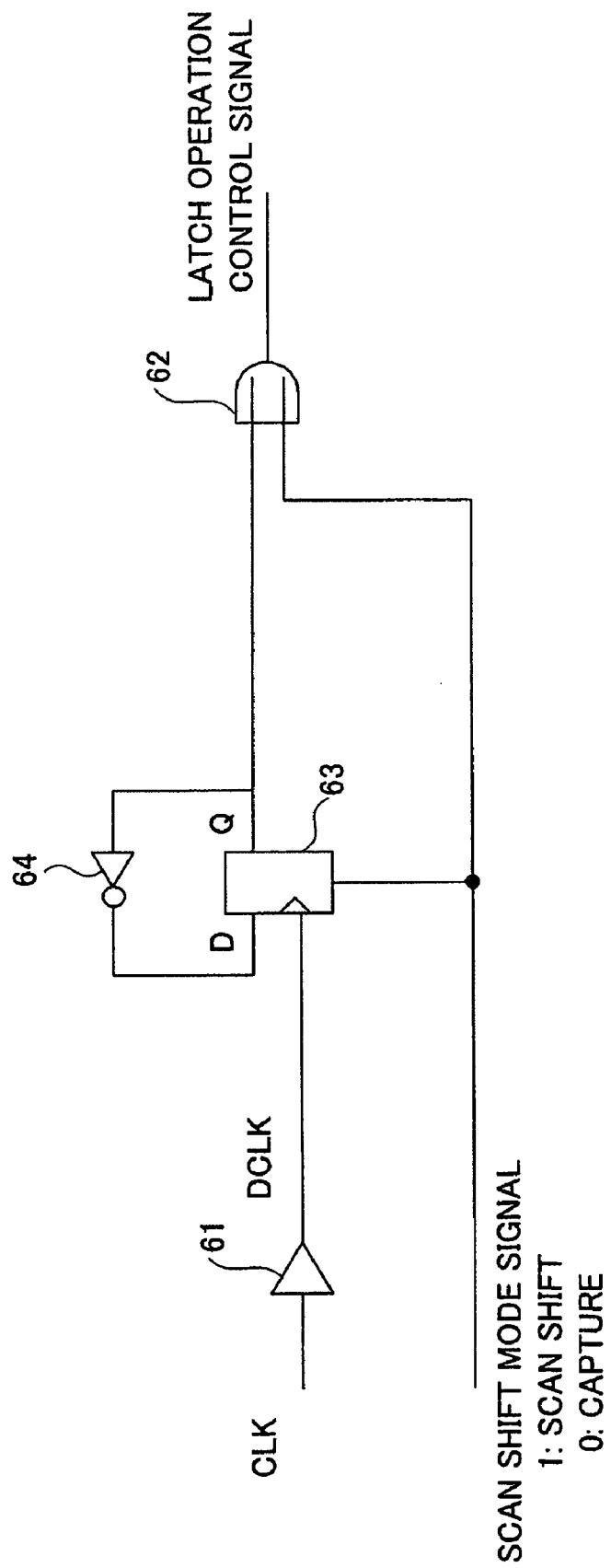
FIG. 12 is a drawing showing another example of the configuration of the latch operation control signal generating circuit.

FIG. 12 is a drawing showing another example of the configuration of the latch operation control signal generating circuit 52. The latch operation control signal generating circuit 52 includes a delay element 61, an OR gate 62, a flip-flop 63, and an inverter 64. The clock signal CLK is delayed by the delay element 61 to generate a delayed clock signal DCLK. The flip-flop 63 performs a toggle operation in synchronization with the rising edges of the delayed clock signal DCLK. The flip-flop 63 is reset by the value "1" of the scan shift mode signal to reset its output to 0.

Figure 13:
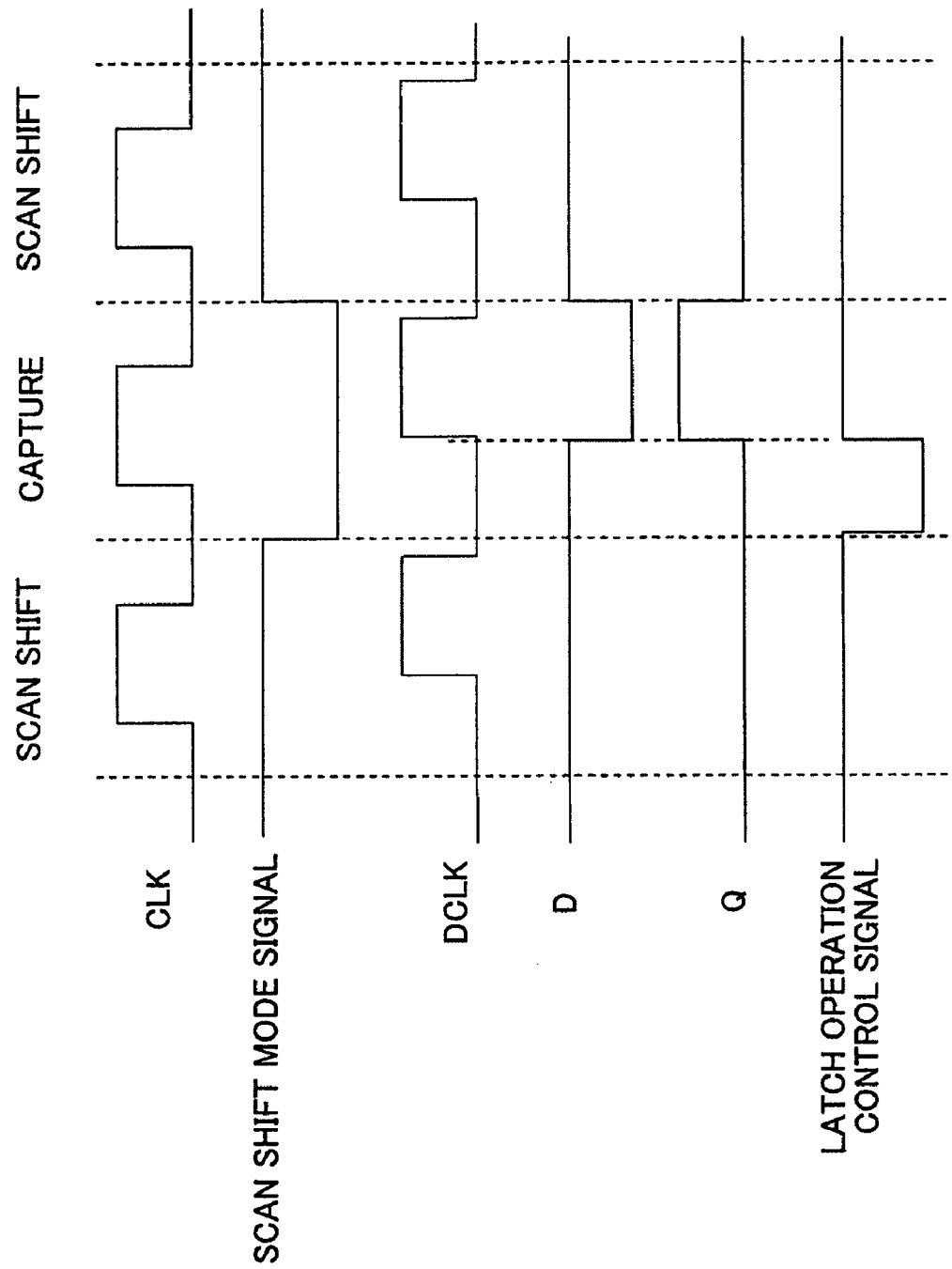
FIG. 13 is a drawing showing signal waveforms of the circuit shown in FIG. 12.

FIG. 13 is a drawing showing signal waveforms of the circuit shown in FIG. 12. As shown in FIG. 13, the output Q of the flip-flop 63 toggles (i.e., changes from 0 to 1 in this example) in response to a rising edge of the delayed clock signal DCLK obtained by delaying the clock signal CLK. When the scan shift mode signal is 1, the flip-flop 63 is in the reset state, with its output Q being fixed to 0. An OR operation is performed between the output Q and the scan shift mode signal to generate the latch operation control signal.

The circuit configuration shown in FIG. 11 simply performs an OR operation between the delayed clock signal DCLK and the scan shift mode signal. In the case of timing relationships as shown in FIG. 13, therefore, the latch operation control signal changes to 0 at a falling edge of the delayed clock signal DCLK during a capture time. In order to avoid this, the delay of the delayed clock signal DCLK may be increased. Since the delay length of the delay element 61 inevitably includes variation, however, it may be difficult to completely eliminate the risk of having a "1"-to-"0" transition in the latch operation control signal. In such a case, it is preferable to use the circuit configuration as shown in FIG. 12.

Figure 14:
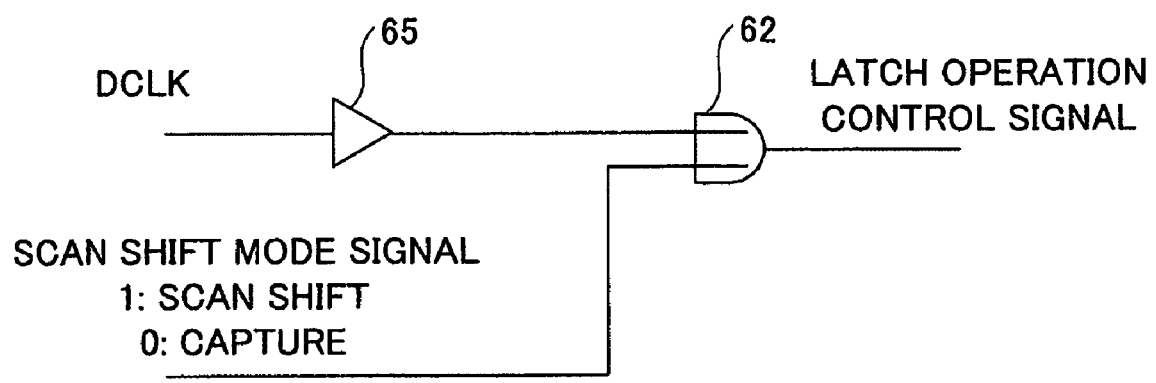
FIG. 14 is a drawing showing another example of the configuration of the latch operation control signal generating circuit.

FIG. 14 is a drawing showing another example of the configuration of the latch operation control signal generating circuit 52. The latch operation control signal generating circuit 52 includes a buffer 65 and an OR gate 62. A delayed clock signal DCLK supplied from an external source is supplied to the OR gate 62 via the buffer 65. The OR gate 62 performs an OR operation between the delayed clock signal DCLK and the scan shift mode signal. The delay of the delayed clock signal DCLK supplied from the external source relative to the clock signal CLK is adjusted to generate a proper latch operation control signal.

Figure 15:
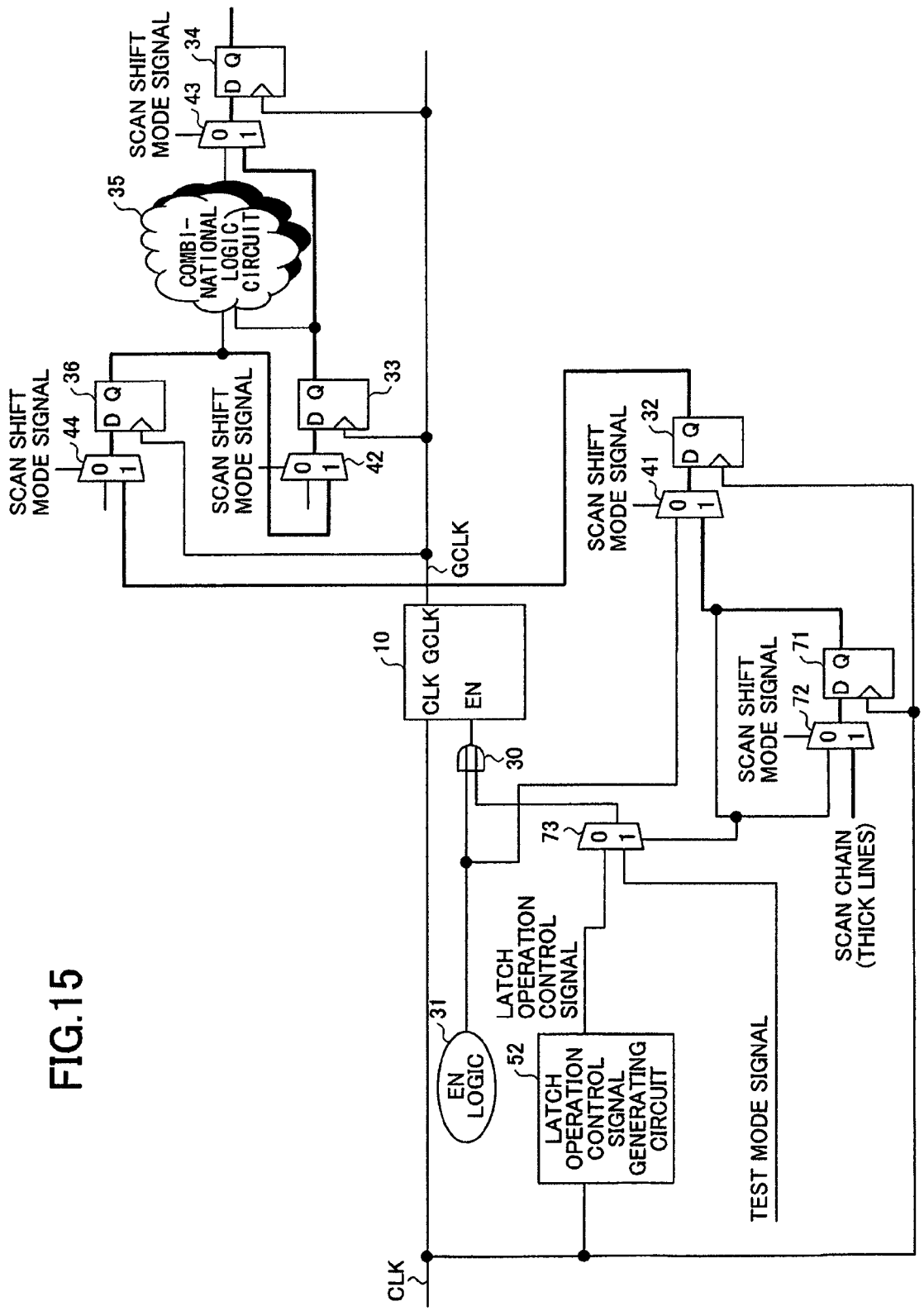
FIG. 15 is a drawing showing a third embodiment of a mechanism for switching a switchable signal.

FIG. 15 is a drawing showing a third embodiment of a mechanism for switching a switchable signal. In FIG. 10, similar elements as those of FIG. 4 and FIG. 10 are referred to by similar numerals, and a description thereof will be omitted. The circuit configuration shown in FIG. 15 includes a flip-flop 71, a selector 72, and a selector 73 in addition to the circuit configuration shown in FIG. 4. The latch operation control signal generating circuit 52 has a configuration as shown in FIG. 11 or FIG. 12.

The selector 73 selects either the latch operation control signal generated by the latch operation control signal generating circuit 52 or the test mode signal for provision to the OR gate 30. The selection control signal for controlling signal selection by the selector 73 is an output signal of the flip-flop 71. The flip-flop 71 and the selector 72 together constitute one scan flip-flop. This scan flip-flop is incorporated into the scan chain, so that a scan shift operation (i.e. scan-in) may set a desired value to the flip-flop 71. The value set in the flip-flop 71 controls the signal selection at the selector 73 to select either the latch operation control signal or the test mode signal.

The latch operation control signal is used for a test when detecting the fault of the latch circuit 11 of the gated clock buffer 10 as well as a stuck-at-1 fault and transition delay fault of the control node EN of the gated clock buffer 10. The test mode signal is supplied to the control node EN of the gated clock buffer 10 for a test for detecting other types of faults. In the test using the test mode signal, the gated clock buffer 10 may be disregarded, so that patterns may be easily generated by use of an automatic test pattern generator.

Figure 16:
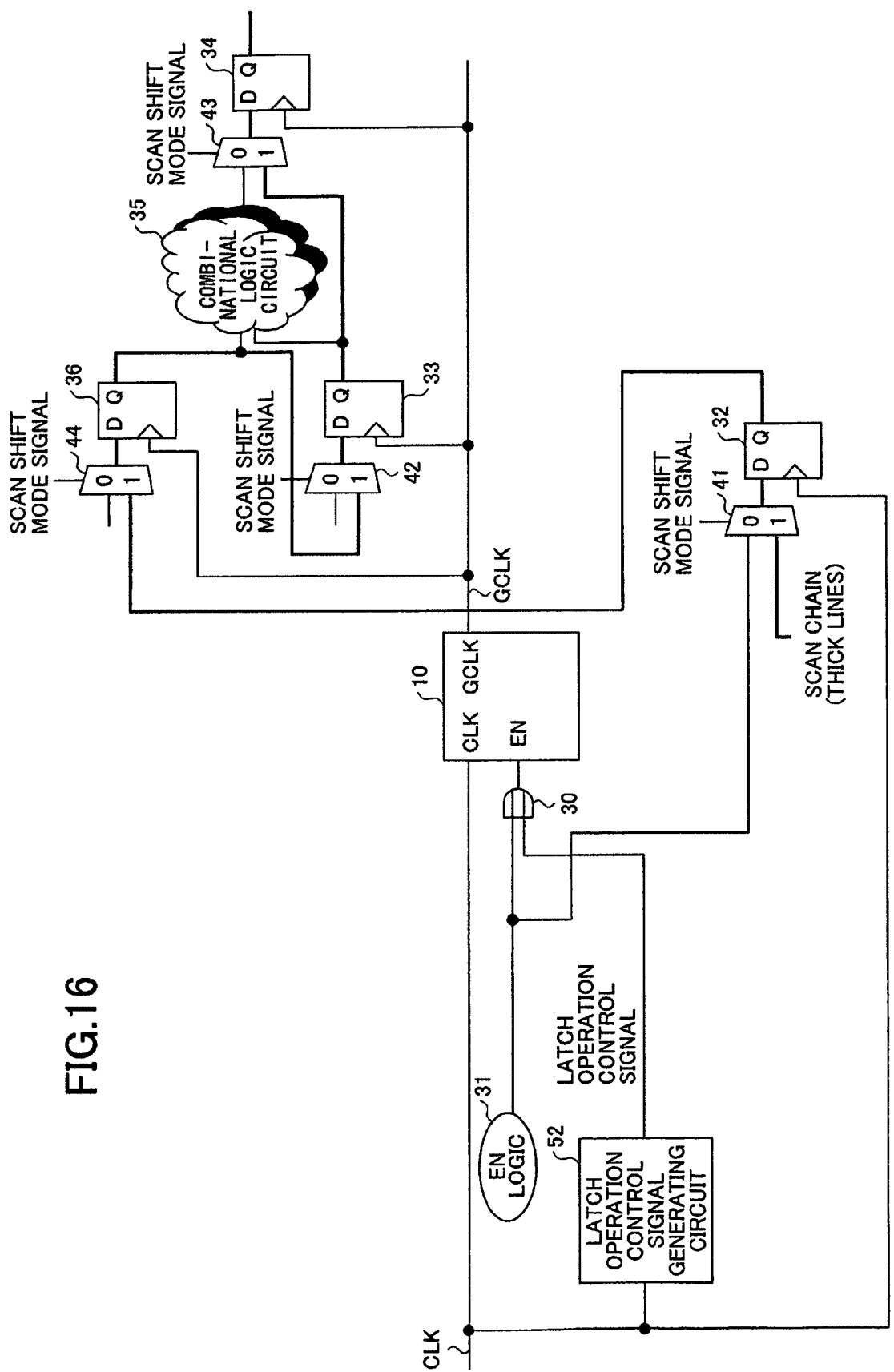
FIG. 16 is a drawing showing an embodiment in which the latch operation control signal is used as a signal for controlling the input into the control node.

FIG. 16 is a drawing showing an embodiment in which the latch operation control signal is used as a signal for controlling the input into the control node EN. In FIG. 16, similar elements as those of FIG. 4 and FIG. 10 are referred to by similar numerals, and a description thereof will be omitted. The circuit configuration shown in FIG. 16 uses the latch operation control signal as the signal for controlling the input into the control node EN that is shown in the circuit configuration shown in FIG. 4. The latch operation control signal assumes an enable value (e.g., 1) during a scan shift operation, and changes from a disable value (e.g., 0) to the enable value (e.g., 1) during a period in which the input clock signal CLK is at the ON state (e.g., 1) during a capture operation. Specifically, the latch operation control signal generated by the latch operation control signal generating circuit 52 having a configuration as shown in FIG. 11 or FIG. 12 is supplied to one of the inputs of the OR gate 30. With the use of such a circuit configuration, an operation fault of the latch circuit 11 of the gated clock buffer 10 may be detected.

Figure 17:
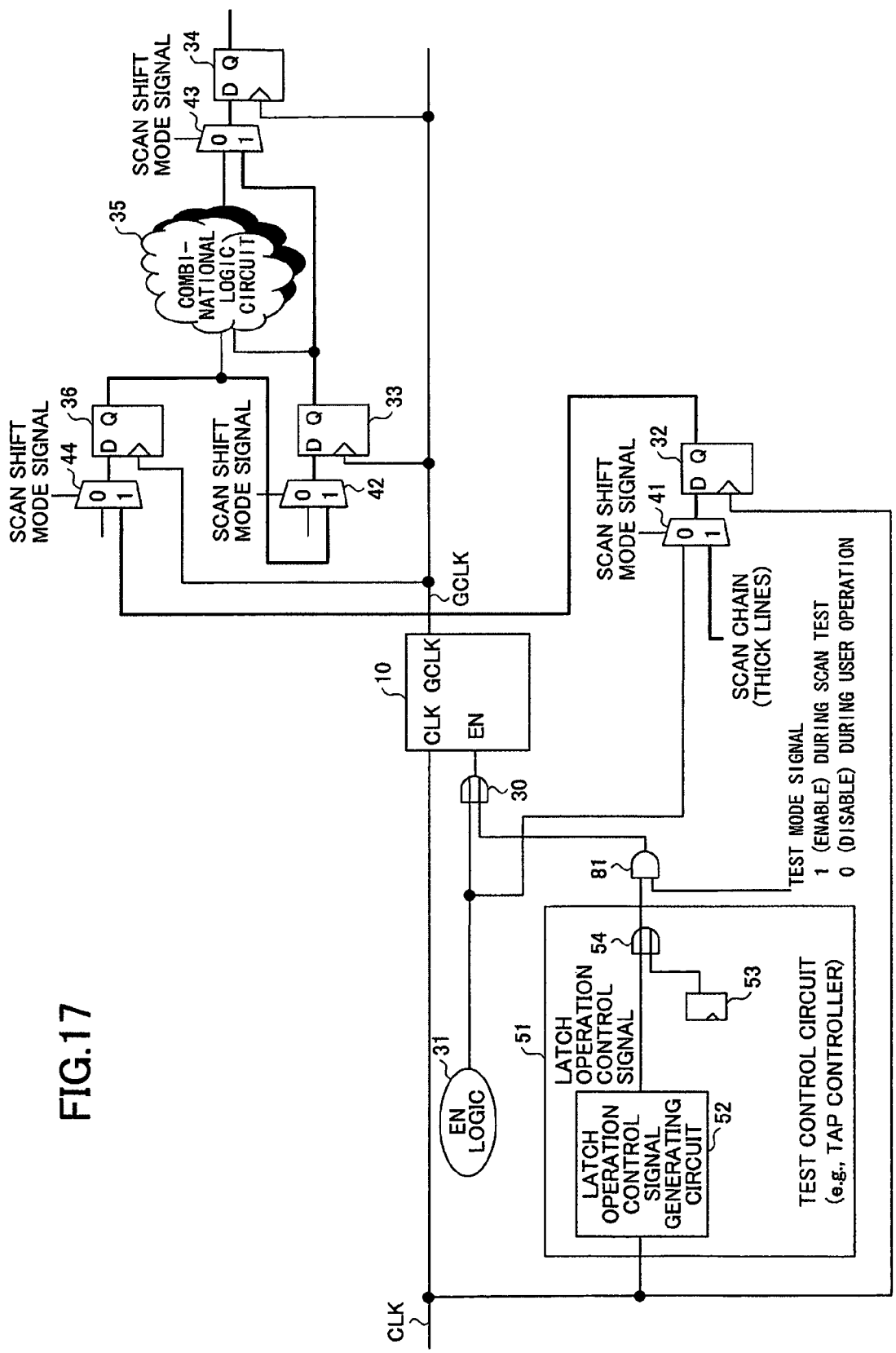
FIG. 17 is a drawing showing a variation of the second embodiment of the mechanism for switching a switchable signal shown in FIG. 10.

FIG. 17 is a drawing showing a variation of the second embodiment of the mechanism for switching a switchable signal shown in FIG. 10. In FIG. 17, similar elements as those of FIG. 10 are referred to by similar numerals, and a description thereof will be omitted. In the configuration shown in FIG. 17, the switchable signal generated by the test control circuit 51 is supplied to one of the inputs of an AND gate 81. The other input of the AND gate 81 receives the test mode signal that is 1 all the time during a scan test, and is 0 all the time during a user operation (i.e., during normal operations other than the test operation). The output of the AND gate 81 is supplied to one of the inputs of the OR gate 30.

When the test mode signal is set to 1 to indicate a scan test, the AND gate 81 allows the output signal of the test control circuit 51 to pass therethrough for provision to the OR gate 30. Accordingly, the input into the control node EN of the gated clock buffer 10 may be controlled in response to the output signal of the test control circuit 51. When the test mode signal is set to 0 to indicate a user operation, the output of the AND gate 81 is fixed to 0, so that the output of the EN logic 31 is always supplied to the control node EN of the gated clock buffer 10. With this circuit configuration, the control for performing a user operation may be easily implemented.

Figure 18:
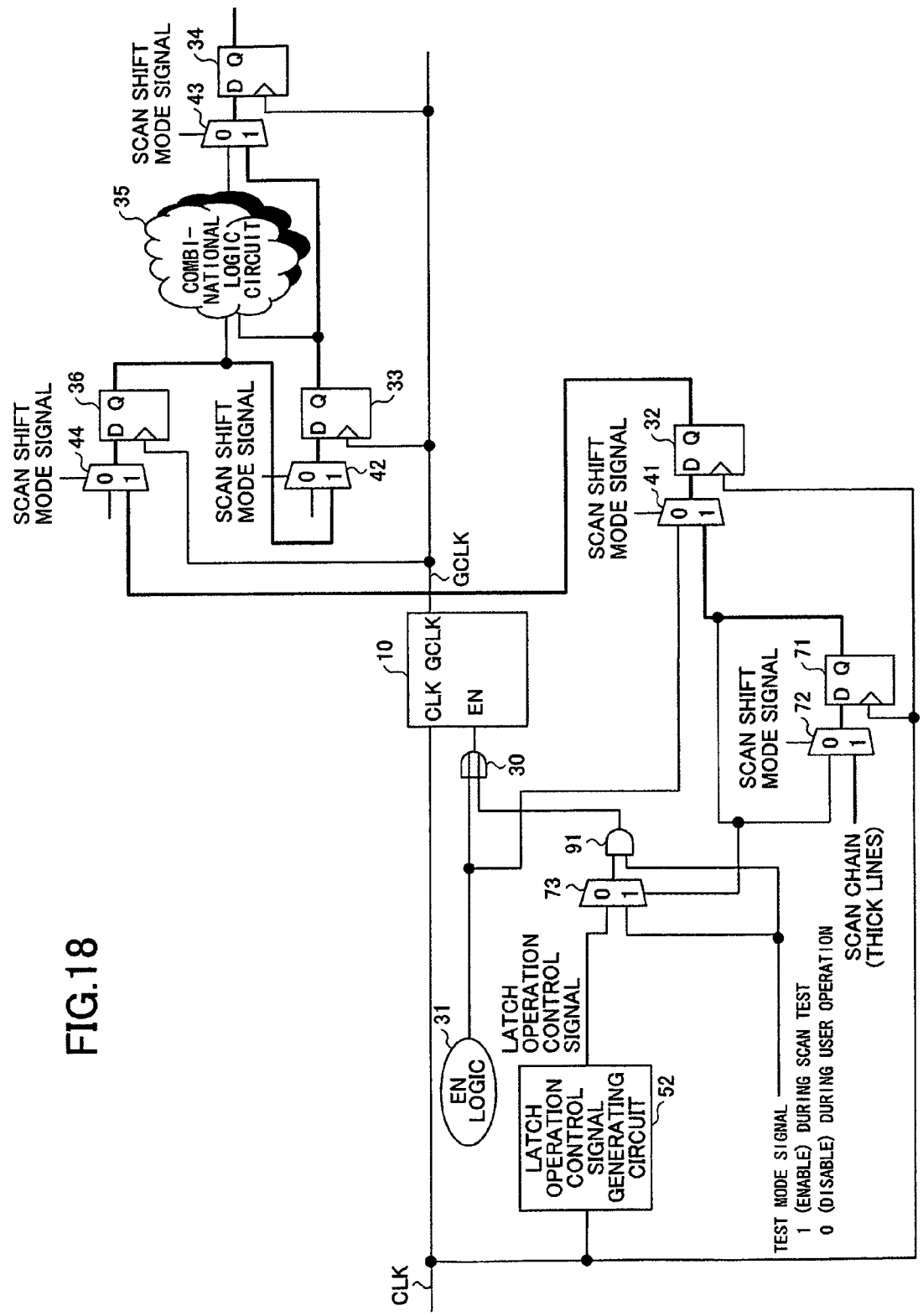
FIG. 18 is a drawing showing a variation of the third embodiment of the mechanism for switching a switchable signal shown in FIG. 15.

FIG. 18 is a drawing showing a variation of the third embodiment of the mechanism for switching a switchable signal shown in FIG. 15. In FIG. 18, similar elements as those of FIG. 15 are referred to by similar numerals, and a description thereof will be omitted. In the configuration shown in FIG. 18, either one of the latch operation control signal and the test mode signal selected by the selector 73 is supplied to one of the inputs of an AND gate 91. The other input of the AND gate 91 receives the test mode signal that is 1 all the time during a scan test, and is 0 all the time during a user operation (i.e., during normal operations other than the test operation). The output of the AND gate 91 is supplied to one of the inputs of the OR gate 30.

When the test mode signal is set to 1 to indicate a scan test, the AND gate 91 allows the output signal of the selector 73 to pass therethrough for provision to the OR gate 30. Accordingly, the input into the control node EN of the gated clock buffer 10 may be controlled in response to either one of the latch operation control signal and the test mode signal. When the test mode signal is set to 0 to indicate a user operation, the output of the AND gate 91 is fixed to 0, so that the output of the EN logic 31 is always supplied to the control node EN of the gated clock buffer 10. With this circuit configuration, the control for performing a user operation may be easily implemented.

Further, the present is not limited to these embodiments, but various variations and modifications may be made without departing from the scope of the present.

What is claimed is:

1. A logic circuit, comprising:
    a gated clock buffer including a control node, being set in either a first state or a second state in response to an input signal applied to the control node, outputting an input clock signal supplied as an output signal in the first state, and fixing an output signal to a constant value in the second state;
    a plurality of scan flip-flops receiving the output signal of the gated clock buffer, and included in at least part of a scan chain; and
    a combinational logic circuit coupled to at least one of the plurality of scan flip-flops,
    wherein the input signal is controlled by a first signal in a first test operation and controlled by a second signal in a second test operation, the first signal assuming an enable value during a test using the scan chain, the second signal assuming an enable value during a scan shift in which the scan chain performs a shift operation, and the second signal assuming both an enable value and a disable value during a capture time in which the at least one of the plurality of scan flip-flops loads data from the combinational logic circuit.

2. The logic circuit as claimed in claim 1, wherein the input signal is controlled by the first signal when a test is performed by setting a first test pattern in the plurality of scan flip-flops, and is controlled by the second signal when a test is performed by setting a second test pattern in the plurality of scan flip-flops.

3. The logic circuit as claimed in claim 1, wherein the input signal is controlled by a third signal in a third test operation, and the third signal assumes a disable value during the capture time.

4. The logic circuit as claimed in claim 1, wherein the second signal assumes the disable value during a portion of the capture time, and changes from the disable value to the enable value during a period in which the input clock signal supplied to the gated clock buffer is in an ON state.

5. The logic circuit as claimed in claim 4, wherein the input signal is controlled by a signal switchable between the first signal, the second signal, and a third signal, the third signal assuming the enable value during the scan shift and assuming the disable value during the capture time.

6. The logic circuit as claimed in claim 1, wherein the first signal and the second signal are supplied directly from an external source outside the logic circuit.

7. The logic circuit as claimed in claim 1, wherein the first signal and the second signal are generated inside the logic circuit.

8. The logic circuit as claimed in claim 7, wherein the signal that controls the input signal applied to the control node is an output signal of a TAP controller.

9. The logic circuit as claimed in claim 1, wherein either one of the first signal and the second signal is selected in response to a value stored in a flip-flop included in the scan chain, the selected signal being used as the signal that controls the input signal applied to the control node.

10. A logic circuit, comprising:
    a gated clock buffer including a control node, being set in either a first state or a second state in response to an input signal applied to the control node, outputting an input clock signal supplied as an output signal in the first state, and fixing an output signal to a constant value in the second state;
    a plurality of scan flip-flops receiving the output signal of the gated clock buffer, and included in at least part of a scan chain; and
    a combinational logic circuit coupled to at least one of the plurality of scan flip-flops,
    wherein the input signal applied to the control node of the gated clock buffer is controlled by a control signal that assumes an enable value during a scan shift in which the scan chain performs a scan operation, and that assumes both an enable value and a disable value during a capture time, wherein the control signal changes from the disable value to the enable value during the capture time while the input clock signal supplied to the gated clock buffer is in an ON state, the capture time being a time period during which the at least one of the plurality of scan flip-flops loads data from the combinational logic circuit.

* * * * *